United States Patent
Lai et al.

(10) Patent No.: US 11,025,236 B1
(45) Date of Patent: Jun. 1, 2021

(54) LOW-POWER AOI-BASED FLIP-FLOP

(71) Applicant: Taiwan Semiconductor Manufacturing Company Limited, Hsinchu (TW)

(72) Inventors: Po-Chia Lai, Fremont, CA (US); Chi-Lin Liu, New Taipei (TW); Greg Gruber, San Jose, CA (US); Stefan Rusu, Sunnyvale, CA (US)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/870,001

(22) Filed: May 8, 2020

(51) Int. Cl.
*H03K 3/037* (2006.01)
*H03K 3/3562* (2006.01)

(52) U.S. Cl.
CPC ......... *H03K 3/0372* (2013.01); *H03K 3/3562* (2013.01); *H03K 3/35625* (2013.01)

(58) Field of Classification Search
CPC . H03K 3/0372; H03K 3/3562; H03K 3/35625
See application file for complete search history.

(56) References Cited

U.S. PATENT DOCUMENTS

| | | | | |
|---|---|---|---|---|
| 6,661,121 | B2* | 12/2003 | Gregor | H03K 3/011 307/106 |
| 7,265,599 | B1* | 9/2007 | Pasqualini | H03K 3/013 327/202 |
| 9,853,630 | B2* | 12/2017 | Kao | H03K 3/35625 |
| 9,923,552 | B2* | 3/2018 | Blutman | H03K 3/012 |
| 10,326,430 | B2* | 6/2019 | Lai | H03K 3/02332 |
| 10,396,761 | B2* | 8/2019 | Hwang | H03K 3/35625 |
| 10,473,718 | B2* | 11/2019 | Agarwal | H03K 3/0372 |

* cited by examiner

*Primary Examiner* — Thomas J. Hiltunen
(74) *Attorney, Agent, or Firm* — Jones Day

(57) ABSTRACT

A flip-flop circuit using AOI and OAI includes: a MUX unit with a multiplexer selecting between a first signal and a second signal; a master unit with two OAI, wherein the first OAI is coupled between a first node N1 and a third node N3, the second OAI is coupled between a second node N2 and a fourth node N4; a slave unit with two AOI, wherein the first AOI is coupled between the third node N3 and a fifth node N5, the second AOI is coupled between the fourth node N4 and a sixth node N6; and a clock for controlling the two AOI and the two OAI, the clock is connected to the first and the second AOI and the first and the second OAI.

20 Claims, 24 Drawing Sheets

```
┌─────────────────────────────────────────────────────────────┐
│ Deploying a scan chain MUX unit with a multiplexer          │─── 2310
│ selecting between a data signal and a scan-in signal        │
└─────────────────────────────────────────────────────────────┘
                              ↓
┌─────────────────────────────────────────────────────────────┐
│ Deploying a master unit with two And-Or-Invert (AOI)        │
│ complex gates, wherein the first AOI complex gate is        │
│ coupled between a first node N1 and a third node N3, the    │─── 2320
│ second AOI complex gate is coupled between a second node    │
│ N2 and a fourth node N4                                     │
└─────────────────────────────────────────────────────────────┘
                              ↓
┌─────────────────────────────────────────────────────────────┐
│ Deploying a slave unit with two Or-And-Invert (OAI)         │
│ complex gates, wherein the first OAI complex gate is        │
│ coupled between the third node N3 and a fifth node N5,      │─── 2330
│ the second OAI complex gate is coupled between the fourth   │
│ node N4 and a sixth node N6                                 │
└─────────────────────────────────────────────────────────────┘
                              ↓
┌─────────────────────────────────────────────────────────────┐
│ Deploying a clock for controlling the two AOI complex gates │
│ and the two OAI complex gates, wherein the clock is         │─── 2340
│ connected to the first and the second AOI complex gates and │
│ the first and the second OAI complex gates                  │
└─────────────────────────────────────────────────────────────┘
                              ↓
┌─────────────────────────────────────────────────────────────┐
│ Wherein the first AOI complex gate and the second AOI       │
│ complex gate are implemented with at least three master     │
│ transistors connected to the clock, wherein the first       │
│ master transistor is a master upper transistor, the second  │
│ and the third master transistors are master lower           │
│ transistors, wherein the second and the third master        │
│ transistors are clock feedback transistors;                 │
│ wherein the first OAI complex gate and the second OAI       │─── 2350
│ complex gate are implemented with at least three slave      │
│ transistors connected to the clock, wherein the first and   │
│ the second slave transistors are slave upper transistors,   │
│ the third slave transistor is a slave lower transistor,     │
│ wherein the first and the second slave transistors are      │
│ clock feedback transistors, wherein a signal from the scan  │
│ chain MUX is transmitted from the master unit to the slave  │
│ unit                                                        │
└─────────────────────────────────────────────────────────────┘
```

FIG. 23

LOW-POWER AOI-BASED FLIP-FLOP

BACKGROUND

Conventional flip-flops use one or more clock inversion with buffer circuits. Therefore, there are more devices consuming power on the clock path. Besides, transmission gates in the conventional flip-flop typically occupy a relatively large area of an integrated circuit, which may require allocation of valuable real estate of the integrated circuit (IC), and, in turn, increase design complexity of the IC.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 23 is a flowchart illustrating another method for lowering flip-flop circuit power using AOI and OAI complex gates, according to the exemplary embodiment.

DETAILED DESCRIPTION

Figure 1:
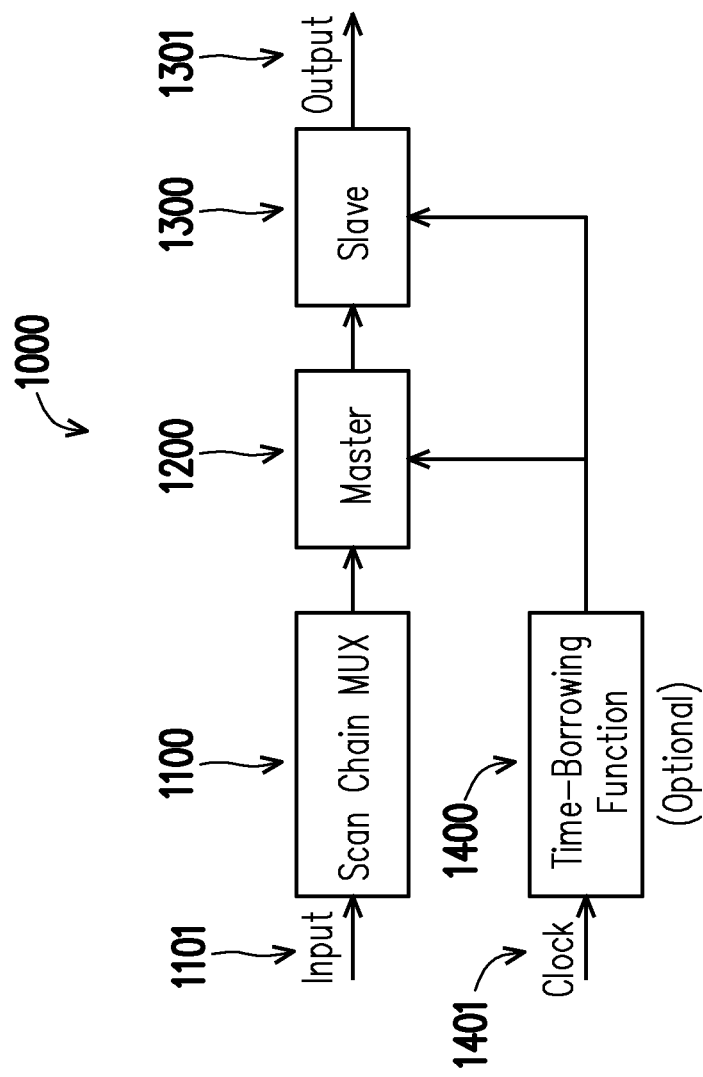
FIG. 1 is a block diagram of a single-bit flop block, according to an exemplary embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

AND-OR-Invert (AOI) logic and AOI gates are two-level compound (or complex) logic functions constructed from the combination of one or more AND gates followed by a NOR gate. Construction of AOI cells can be efficient using CMOS technology where the total number of transistor gates is comparable to to the same construction using NAND logic or NOR logic. The complement of AOI Logic is OR-AND-Invert (OAI) logic where the OR gates precede a NAND gate. AOI gates may be implemented such that the total number of transistors (or gates) is less than if the AND, NOT, and OR functions were implemented separately. This may result in in increased speed, reduced power, smaller area, and potentially lower fabrication cost. For example, a 2-1 AOI gate can be constructed with 6 transistors in CMOS compared to 10 transistors using a 2-input NAND gate (4 transistors), an inverter (2 transistors), and a 2-input NOR gate (4 transistors).

Transmission gate flip-flops can have twelve transistors connected to the clock including two minimum sized inverters inside every cell. When the number of clock connected transistors are reduced from twelve to eight by implementing AOI complex gates, the power consumption can be reduced (e.g., by eighteen percent).

According to the illustrations below, the master-slave circuit can have different variants by changing the corresponding placement of transistors. According to the illustrations below, variants can have six clock-connected transistors. Multi-bit flip-flops can be implemented by duplicating the master-slave circuits. According to the illustrations below, time-borrowing functions can be implemented in the design.

FIG. 1 is a block diagram of a single-bit flop block according to an exemplary embodiment. According to some embodiments, a single-bit flop block 1000 includes a scan chain multiplexer 1100, a master latch circuit (or "master") 1200 and a slave latch circuit (or "slave") 1300. Scan chain testing is one of various techniques that utilize Design for Testability (DFT) methods to detect manufacturing faults in an IC. One or more scan flip-flops may be implemented to perform a scan chain testing on an IC, as depicted in FIG. 1. The input 1101 is transmitted into the scan chain multiplexer 1100, then transmitted to the master latch circuit 1200, then transmitted to the slave latch circuit 1300, and the output 1301 is sent out. As an option, the single-bit flop block 1000 can include, in addition, a time-borrowing function module 1400. The clock signal 1401 is transmitted to the time borrowing function module 1400 and then transmitted to the master latch circuit 1200 and the slave latch circuit 1300. According to some embodiments, the flop block 1000 is a single-bit implementation. As will be illustrated below, the single-bit flop block 1000 can be duplicated to produce multi-bit flop blocks.

Figure 2:
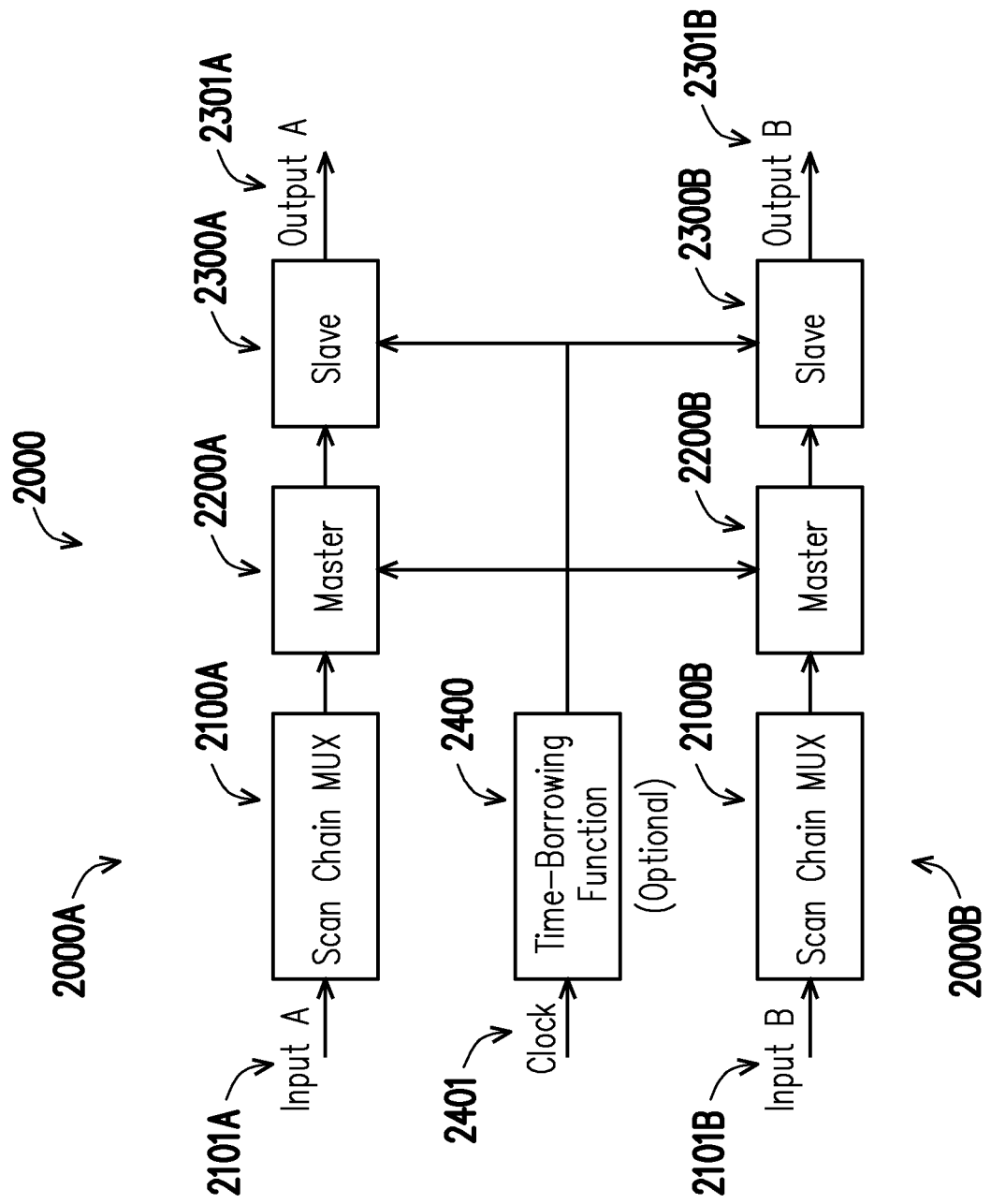
FIG. 2 is a block diagram of a multi-bit flop block, according to the exemplary embodiment.

FIG. 2 is a block diagram of a multi-bit flop block according to the exemplary embodiment. According to some embodiments, the multi-bit flop block 2000 includes a first bit flop block 2000A and a second bit flop block 2000B. The first bit flop block 2000A includes a MUX 2100A, a master latch circuit 2200A, a slave latch circuit 2300A. The first bit input 2101A is transmitted into the MUX 2100A, and the first bit output 2301A is sent out from the slave latch circuit 2300A. The second bit flop block 2000B has a similar configuration, with a MUX 2100B, a master 2200B and a slave 2300B, the corresponding input and output are 2101B and 2301B. According to some embodiments, the time-borrowing function module 2400 is shared by all bits, with the clock 2401 transmitting through the time-borrowing function module controlling masters (2200A and 2200B) and slaves (2300A and 2300B) of all bits. According to some embodiments, the MUX 2100A and 2100B can be used for purposes other than scan chain.

Figure 3:
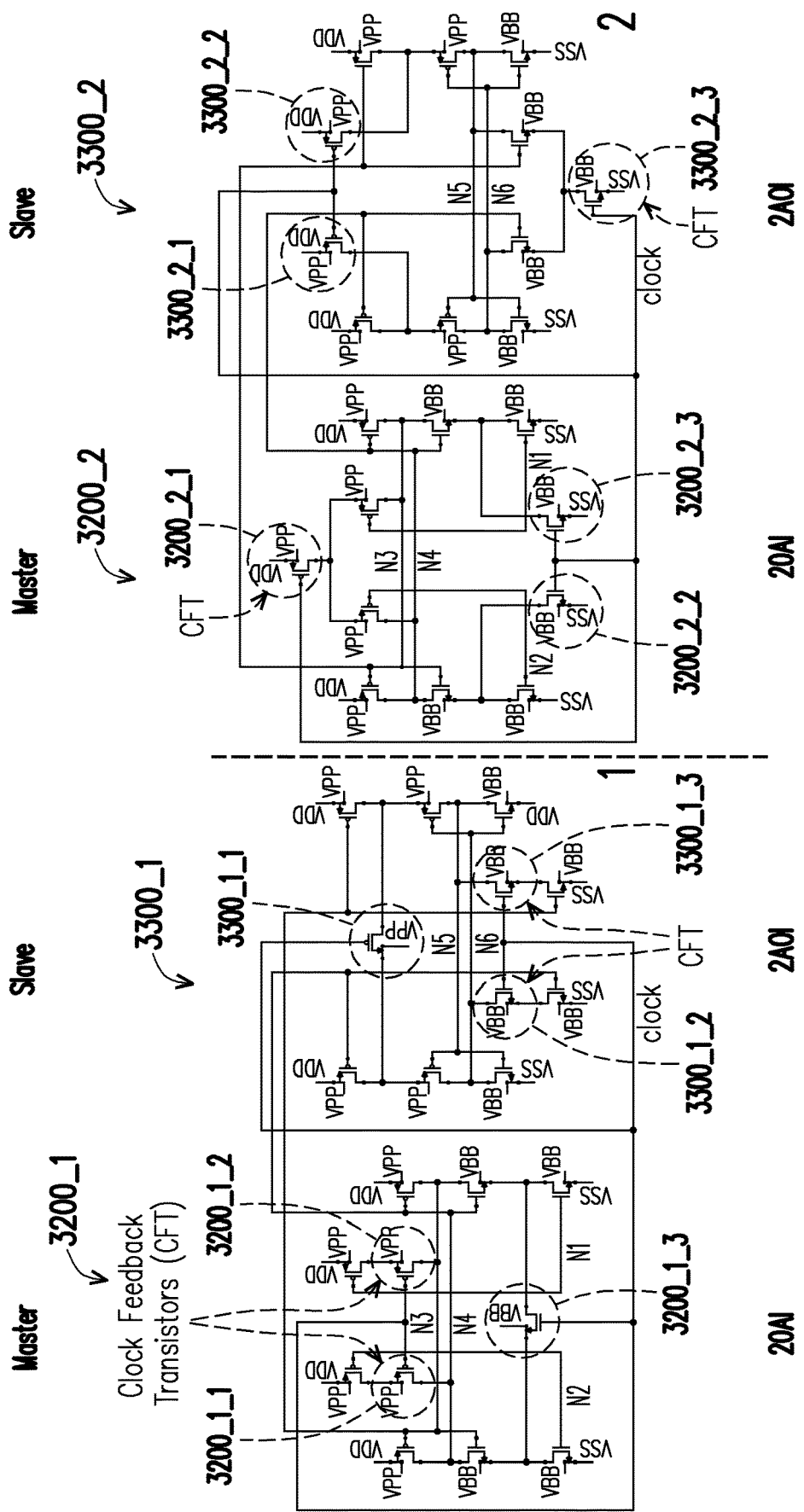
FIG. 3 are two transistor level circuit diagrams of a master-slave block with only six clock-connected transistors, according to the exemplary embodiment.
Figure 4:
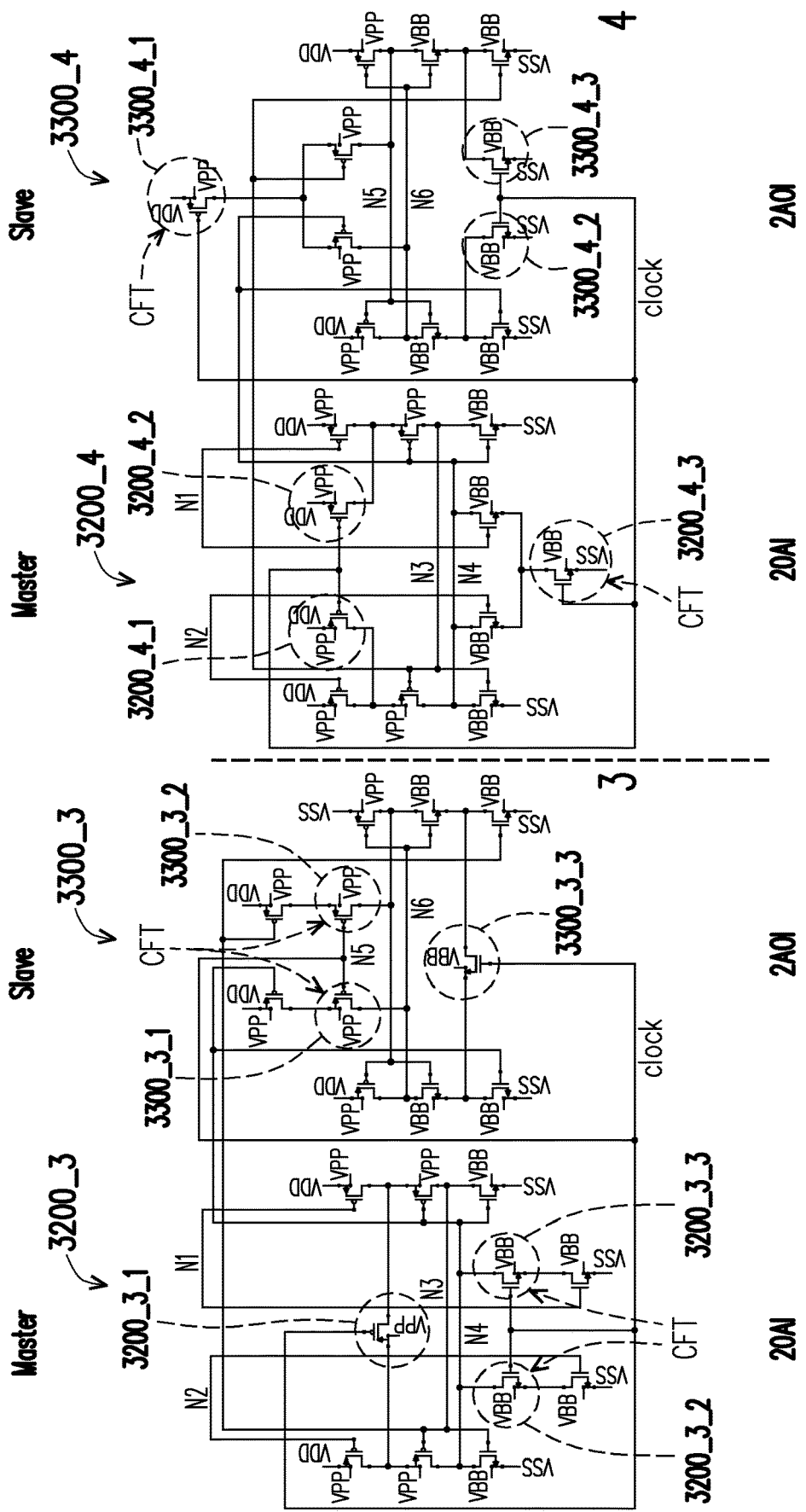
FIG. 4 are two transistor level circuit diagrams of a master-slave block with only six clock-connected transistors, according to the exemplary embodiment.

FIG. 3 and FIG. 4 illustrate four transistor level circuit diagrams of a master-slave block with only six clock-connected transistors. FIG. 5 is a gate-level circuit diagram of a master-slave block corresponding to FIG. 3 and FIG. 4, according to the exemplary embodiment. FIGS. 3, 4 and 5 will be described together below.

Figure 5A:
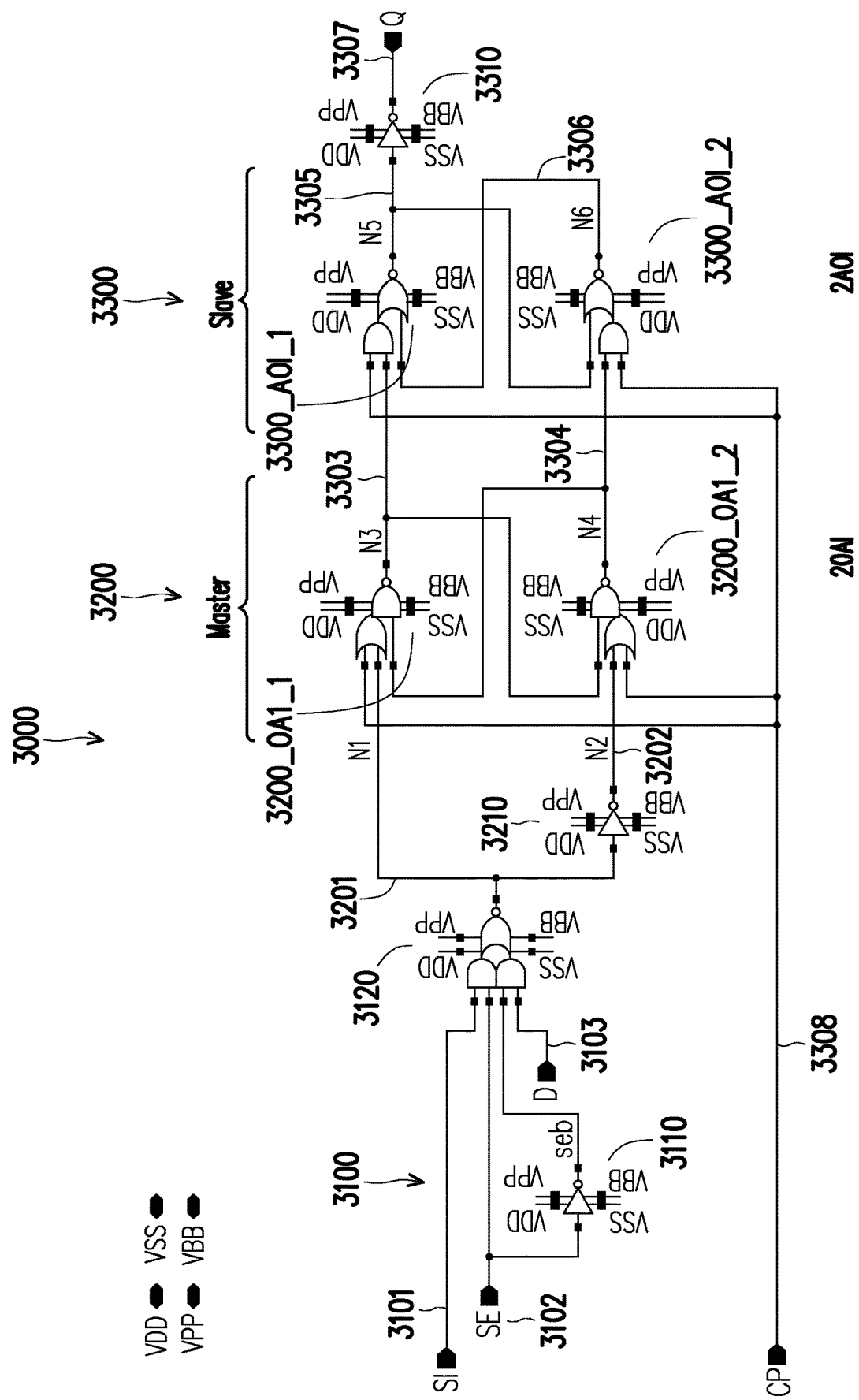
FIG. 5A is a gate-level circuit diagram of a master-slave block, according to the exemplary embodiment.

The gate level circuit 3000 in FIG. 5A is configured to receive input signals SI 3101, SE 3102 and D 3103, and to provide an output signal Q 3307 based on a synchronization clock signal CP 3308. Signals SI 3101, SE 3102 and D 3103 are transmitted to the multiplexer 3120, the output of the multiplexer 3120 is transmitted to the master latch circuit 3200. The synchronization clock signal CP 3308 is transmitted to both the master 3200 and the slave 3300. Output is received on the output end of the inverter 3310. The OAI logic gates (3200_OAI_1 and 3200_OAI_2) and AOI logic gates (3300_AOI_1 and 3300_AOI_2) operate according to the respective truth tables shown in FIG. 5B below. The clock signal CP 3308 operates to control the open and close of the master 3200 and slave 3300. For example, when the clock signal CP 3308 is high, the slave 3300 is open and the master 3200 latches the signal; in comparison, when the clock signal CP 3308 is low, the master 3200 is open and the slave 3300 latches the signal. In other embodiments discussed below, the clock signal CP operates in similar ways to control the open and close of the master and slave, details will be discussed in the following paragraphs. According to some embodiments, the input signal D 3103 can be a data signal (first signal) provided from the respective subset of logic gates of the to-be tested circuit. According to some embodiments, the data signal (first signal) 3103 can include data generated based on logic operations of the respective subset of logic gates. The input signal SI 3101 can be a scan-in signal (second signal) implemented to provide the scan test. According to some embodiments, the scan-in SI signal 3101 can include one or more test patterns that are implemented to detect faults of scan flip-flop circuit. The scan-in signals (second signal) can be provided by an automatic test pattern generator (ATPG). The input signal SE 3102 can be a scan-enable signal that is implemented to selectively cause the scan flip-flop circuit 3000 to operate under either normal mode or the scan test mode. According to some embodiments, the clock synchronization signal 3308 can be a clock signal which is implemented to provide a clock reference for the output signal 3307 to follow either the data signal (first signal) D 3103, or the scan-in signal (second signal) SI 3101, depending on the mode of the scan flip-flop circuit 3000 selected to operate.

According to some embodiments, the scan flip-flop circuit 3000 includes a first inverter 3110, a multiplexer 3120, a second inverter 3210, a master latch circuit (master) 3200, a slave latch circuit (slave) 3300, and a third inverter 3310. According to some embodiments, the multiplexer 3120 is configured to selectively couple either the data signal (first signal) D 3103, or the scan-in signal (second signal) SI 3101 to the master latch circuit 3200 and slave latch circuit 3300 based on the scan-enable signal SE 3102. For example, when the SE 3102 is asserted to a logical low state (e.g., a logical "0") the multiplexer 3120 can couple the data signal (first signal) D 3103 to the master latch circuit 3200 and the slave latch circuit 3300. In comparison, when the SE 3102 is asserted to a logical high state (e.g., a logical "1"), then the multiplexer 3120 can couple the SI signal 3101 to the master latch circuit 3200 and the slave latch circuit 3300. According to some embodiments, when the data signal (first signal) D 3103 is selected to couple to the master and slave latch circuits 3200 and 3300, the master and slave latch circuits 3200 and 3300 are configured to cause the output signal 3307 to follow the data signal (first signal) D 3103 based on the clock signal CP 3308. As discussed earlier, each of the OAI gates and AOI gates operates according to the respective truth tables in shown FIG. 5B, and when the clock signal CP 3308 is high, the slave 3300 is open and the master 3200 latches the signal; in comparison, when the clock signal CP 3308 is low, the master 3200 is open and the slave 3300 latches the signal. According to some embodiments, the multiplexer 3120 receives input signals SI 3101, SE 3102 and D 3103 to produce output signal 3201 and feed to OAI gate 3200_OAI_1, 3201 is also fed to the inverter 3210 to become signal 3202, signal 3202 is then transmitted to OAI gate 3200_OAI_2. Logic operations are performed on the OAI gates and AOI gates with clock signal CP 3308 according to the corresponding logic truth tables shown in FIG. 5B. Output from gate 3200_OAI_1 is 3303, and output from gate 3200_OAI_2 is 3304, they are transmitted to the gates 3300_AOI_1 and 3300_AOI_2 in the slave 3300 respectively. Logic operations are again performed with clock signal CP 3308 according to the corresponding logic truth tables shown in FIG. 5B. The output 3305 is transmitted to the inverted 3310 to produce the output signal Q, 3307.

Figure 13:
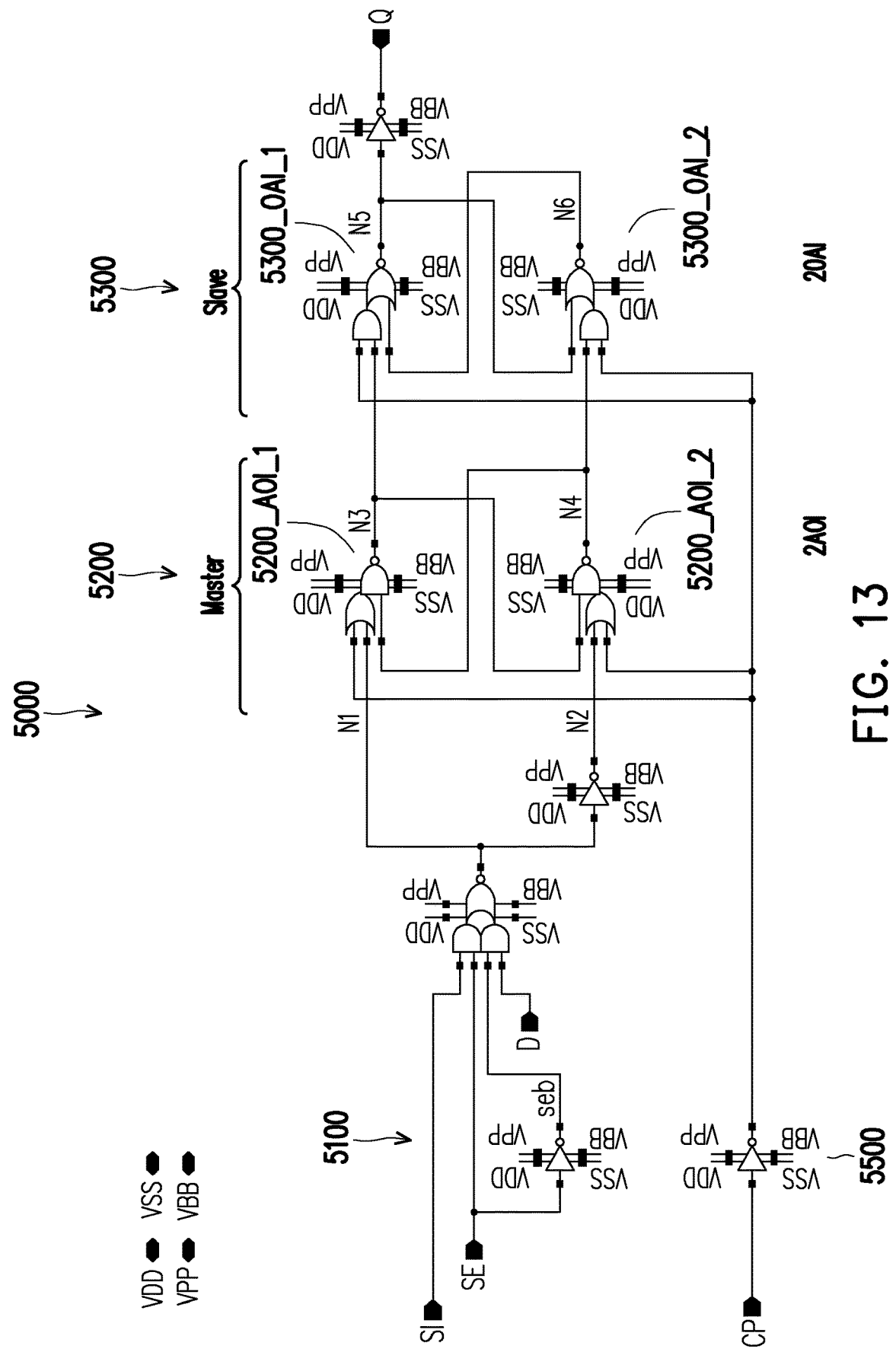
FIG. 13 is a gate-level circuit diagram of a master-slave block with local clock buffer, according to the exemplary embodiment.

FIG. 3 illustrates two transistor level circuit diagrams (scenario 1 and scenario 2) of a master-slave block with only six clock-connected transistors according to the exemplary embodiment. FIG. 4 illustrates two transistor level circuit diagrams (scenario 3 and scenario 4) of a master-slave block with only six clock-connected transistors according to the exemplary embodiment. FIG. 5A illustrates the gate-level circuit corresponding to scenarios 1 and 2 in FIG. 3. FIG. 13 illustrates the gate-level circuit corresponding to scenarios 3 and 4 in FIG. 4. The master in FIG. 5A is implemented by two OAI's, and the slave is implemented by two AOI's. Accordingly as illustrated in FIG. 3 in scenario 1, the master 3200_1 is implemented by two OAI's, and the slave 3300_1 is implemented by two AOI's; in scenario 2, the master 3200_2 is implemented by two OAI's, and the slave 3300_2 is implemented by two AOI's. According to some embodiments, in scenario 1 in FIGS. 3, 3200_1_1 and 3200_1_2 correspond to 3200_OAI_1 in FIG. 5A, 3200_1_3 corresponds to 3200_OAI_2 in FIG. 5A, 3300_1_1 corresponds to 3300_AOI_1 in FIG. 5A, 3300_1_2 and 3300_1_3 correspond to 3300_AOI_2 in FIG. 5A. According to some embodiments, in scenario 2 in FIG. 3, 3200_2_1 corresponds to 3200_OAI_1 in FIG. 5A, 3200_2_2 and 3200_2_3 correspond to 3200_OAI_2 in FIG. 5A, 3300_2_1 and 3300_2_2 correspond to 3300_AOI_1 in FIG. 5A, 3300_2_3 corresponds to 3300_AOI_2 in FIG. 5A. The master in FIG. 13 is implemented by two AOI's, and the slave is implemented by two OAI's. Accordingly as illustrated in FIG. 4 in scenario 3, the master 3200_3 is implemented by two AOI's, and the slave 3300_3 is implemented by two OAI's; in scenario 4, the master 3200_4 is implemented by two AOI's, and the slave 3300_4 is implemented by two OAI's. According to some embodiments, in scenario 3 in FIG. 4, 3200_3_1 corresponds to 5200_AOI_1 in FIGS. 13, 3200_3_2 and 3200_3_3 correspond to 5200_AOI_2 in FIGS. 13, 3300_3_1 and 3300_3_2 correspond to 5300_OAI_1 in FIG. 13, 3300_3_3 corresponds to 5300_OAI_2 in FIG. 13. According to some embodiments, in scenario 4 in FIGS. 4, 3200_4_1 and 3200_4_2 corresponds to 5200_AOI_1 in FIG. 13, 3200_4_3 corresponds to 5200_AOI_2 in FIG. 13, 3300_4_1 corresponds to 5300_OAI_1 in FIGS. 13, 3300_4_2 and 3300_4_3 correspond to 5300_OAI_2 in FIG. 13. Details will be presented in the discussions of corresponding figures below. In FIG. 5A, master 3200 and slave 3300 are implemented using AOI and OAI gates without pass-gates. In FIG. 5A, the master 3200 includes two cross-coupled OAI gates: 3200_OAI_1 and 3200_OAI_2, meaning that 3200_OAI_1 and 3200_OAI_2 each includes an output coupled to the other input. The OAI gate 3200_OAI_1 is coupled between nodes N1 and N3, the OAI gate 3200_OAI_2 is coupled between nodes N2 and N4. The slave 3300 includes two cross-coupled AOI gates: 3300_AOI_1 and 3300_AOI_2, meaning that 3300_AOI_1 and 3300_AOI_2 each includes an output coupled to the other input. 3300_AOI_1 and 3300_AOI_2 are coupled between nodes N3 and N5, and N4 and N6 correspondingly. The 3200_OAI_1 is coupled to the multiplexer 3120, and 3200_OAI_2 is coupled to the multiplexer 3120 through the second inverter 3210. More specifically, the 3200_OAI_1 is configured to receive either the data signal (first signal) D 3103, or the scan-in signal (second signal) SI 3101, and a signal 3304 provided by the 3200_OAI_2. The 3200_OAI_1 is further configured to perform an "OAI" logic function on the signals 3201 and 3304 based on the clock signal CP 3308, and provide output signal 3303. Similarly, the cross-coupled 3200_OAI_2 is configured to receive either a logically inverted data signal (first signal) D 3103, or a logically inverted scan-in signal (second signal) SI 3101 through the inverter 3210 (hereafter signal 3202), and also the signal 3303 provided by the 3200_OAI_1. Then the 3200_OAI_2 is configured to perform the "OAI" logic function on the signals 3202 and 3303 based on the clock signal CP 3308, and provide output signal 3304.

According to some embodiments, the output signals 3303 and 3304 are provided to the cross-coupled 3300_AOI_1 and 3300_AOI_2 of the slave latch circuit 3300. More specifically, the 3300_AOI_1 is configured to receive the signal 3303 and a signal 3306 provided by the 3300_AOI_2, then perform an "AOI" logic function on the signals 3303 and 3306 based on the clock signal CP 3308, and provide output signal 3305 to the third inverter 3310. The 3300_AOI_2 is configured to receive the signal 3304 and 3305 provided by the 3300_AOI_1, then perform an "AOI" logic function on the signals 3304 and 3305 based on the clock signal CP 3308, and provide output signal 3306. According to some embodiments, the third inverter 3310 can provide the output signal 3307 based on a logical inversion of the signal 3305.

According to some embodiments, the OAI complex gates 3200_OAI_1 and 3200_OAI_2 of the master latch circuit 3200 and the AOI complex gates 3300_AOI_1 and 3300_AOI_2 of the slave latch circuit 3300 can be activated complementarily in accordance with the clock signal CP 3308. More specifically, when the clock signal CP 3308 transitions from a low logical state to a high logical state (i.e., the clock signal CP 3308 at the high logical state), the master latch circuit 3200 is activated and the slave latch circuit 3300 is deactivated. As such, the master latch circuit 3200 can latch either the data signal (first signal) D 3103, or SI 3101 to the third inverter 3310 while the slave latch circuit 3300 can serve as a transparent circuit. When the clock signal CP 3308 transitions from the high logical state to the low logical state (i.e., the clock signal CP 3308 at the low logical state), the master latch circuit 3200 is deactivated and the on the other hand, the slave latch circuit 3300 is activated. As such, the slave latch circuit 3300 can directly latch either the data signal (first signal) D 3103 or SI 3101 to the third inverter 3310 while the master latch circuit 3200 serve as a transparent circuit.

The MUX 3100 in FIG. 5A is not shown in FIGS. 3 and 4. Only the master 3200 and the slave 3300 are illustrated on transistor level in FIGS. 3 and 4. The master and slave in scenarios 3 and 4 in FIG. 4 are swapped compared to scenarios 1 and 2 in FIG. 3 to account for clock inversion, which will be discussed later in FIG. 13 and FIG. 17. According to some embodiments, the MUX 3100 can be used for purposes other than scan chain.

In FIG. 3, scenario 1, the master 3200_1 includes a plurality of transistors. As discussed above, the master 3200_1 is implemented by two OAI's, and the slave 3300_1 is implemented by two AOI's as denoted in FIG. 3. In particular, the first OAI corresponds to 3200_OAI_1 in FIG. 5A, and the second OAI corresponds to 3200_OAI_2 in FIG. 5A. According to some embodiments, in FIG. 3, 3200_OAI_1 and 3200_OAI_2 are collectively implemented by at least three transistors: 3200_1_1, 3200_1_2 and 3200_1_3. Among the three transistors, 3200_1_1 and 3200_1_2 are upper transistors, and 3200_1_3 is a lower transistor. The words "upper" and "lower" are used to describe the relative positions of the transistors in circuit diagrams such as FIG. 3 and FIG. 4. It is well known to a person of ordinary skill in the art, that as long as the circuit configurations are maintained, the relative positions of the transistors can be moved without affecting the overall circuit structure and function. The words "upper" and "lower" are not meant to be used to limit the petitioning of the transistors. According to some embodiments, the upper transistors 3200_1_1 and 3200_1_2 in the master are clock feedback transistors ("CFT") which are connected to the "clock" signal at the bottom. The gates of 3200_1_1 and 3200_1_2 are connected to each other, named N3 as illustrated in FIG. 3, N3 is then connected to the gate of 3200_1_3 and is further connected to the clock signal. As illustrated in FIG. 5A, they are both connected to CP 3308. Similar to the discussion earlier, when the clock signal (i.e., CP 3308 in FIG. 5A) is high, the slave 3300_1 is open, and the master 3200_1 latches the signal; when the clock signal is low, the master 3200_1 is open and the slave 3300_1 latches the signal.

According to some embodiments, the slave 3300_1 also includes a plurality of transistors. In particular, the first AOI(3300_1_1) corresponds to 3300_AOI_1 in FIG. 5A, and the second AOI(3300_1_2 and 3300_1_3) corresponds to 3300_AOI_2 in FIG. 5A. According to some embodiments, 3300_AOI_1 and 3300_AOI_2 are collectively implemented by at least three transistors: 3300_1_1, 3300_1_2 and 3300_1_3. Among the three transistors, 3300_1_1 is an upper transistor, and 3300_1_2 and 3300_1_3 are two lower transistors. According to some embodiments, the lower transistors 3300_1_2 and 3300_1_3 in the slave are CFT.

If each of all four gates (3200_OAI_1, 3200_OAI_2, 3300_AOI_1 and 3300_AOI_2) is implemented by two clock transistors, then the total number of clock transistors is eight, and the total power consumption of the circuit 3000 will be increased. In comparison, if each of all four gates (3200_OAI_1, 3200_OAI_2, 3300_AOI_1 and 3300_AOI_2) is implemented by only one clock transistor, then the total number of clock transistors is four, then the total leakage power of the circuit 3000 will be increased. In comparison, when four gates (3200_OAI_1, 3200_OAI_2, 3300_AOI_1 and 3300_AOI_2) are implemented by six clock transistors (3200_1_1, 3200_1_2, 3200_1_3, 3300_1_1, 3300_1_2 and 3300_1_3) as illustrated in scenario 1 of FIG. 3, the total power consumption of the circuit 3000 is reduced while at the same time the total leakage power is also reduced. Such a minimized complex gate transistor network reduces the number of clock-connected transistors from eight (when all complex gates are implemented with two transistors) to six. Such design considerations apply to the rest of the figures.

In scenario 2, as discussed above, the master 3200_2 is implemented by two OAI's, and the slave 3300_2 is implemented by two AOI's as denoted in FIG. 3. According to some embodiments, scenario 2 is a variation of scenario 1 by merging the master CFT pair (3200_1_1 and 3200_1_2) in scenario 1 into master CFT 3200_2_1 in scenario 2, by splitting the master lower transistor 3200_1_3 in scenario 1 into master lower transistor pair (3200_2_2 and 3200_2_3) in scenario 2, by splitting the slave upper transistor 3300_1_1 into slave upper transistor pair (3300_2_1 and 3300_2_2), and by merging the slave lower CFT pair (3300_1_2 and 3300_1_3) into the slave lower CFT 3300_2_3. Similar to scenario 1, 3200_OAI_1 and 3200_OAI_2 are collectively implemented by at least three transistors: 3200_2_1, 3200_2_2 and 3200_2_3; 3300_AOI_1 and 3300_AOI_2 are collectively implemented by at least three transistors: 3300_2_1, 3300_2_2 and 3300_2_3, where 3300_2_3 is shared. Similar to scenario 1, the gates of CFT transistors are all connected to the clock signal. The gate of the CFT transistor 3200_2_1 in the master is connected to the clock, and the gate of the CFT transistor 3300_2_3 is also connected to the clock. Logic operations are performed according to the corresponding truth tables illustrated in FIG. 5B as discussed in details in later paragraphs. Similar to the discussion earlier, when the clock signal (i.e., CP 3308 in FIG. 5A) is high, the slave 3300_2 is open, and the master 3200_2 latches the signal; when the clock signal is low, the master 3200_2 is open and the slave 3300_2 latches the signal. Similar to scenario 1, the total number of transistors implementing the gates is still six, as compared to eight transistors in conventional gates. Because the total number of transistors is reduced from eight to six, both total power consumption and total leakage power are minimized.

As discussed above, scenarios 3 and 4 in FIG. 4 correspond to the gate-level figure in FIG. 13. In FIG. 13, the master 5200 is implemented by two AOI's, 5200_AOI_1 and 5200_AOI_2, respectively, and the slave 5300 is implemented by two OAI's, 5300_OAI_1 and 5300_OAI_2, respectively. In FIG. 4, the two AOI's in the master are further implemented by three transistors, and the two OAI's in the slave are further implemented by three transistors. For example, in scenario 3, 5200_AOI_1 and 5200_AOI_2 are collectively implemented by at least three transistors: 3200_3_1, 3200_3_2 and 3200_3_3, where the master upper transistor 3200_3_1 is shared and the mater lower transistor pair (3200_3_2 and 3200_3_3) are both CFT's; 5300_OAI_1 and 5300_OAI_2 are collectively implemented by at least three transistors: 3300_3_1, 3300_3_2 and 3300_3_3, where the slave lower transistor 3300_3_3 is shared and the slave upper transistor pair (3300_3_1 and 3300_3_2) are both CFT's. Similar to the discussion earlier, when the clock signal (i.e., CP 3308 in FIG. 5A) is high, the slave 3300_3 is open, and the master 3200_3 latches the signal; when the clock signal is low, the master 3200_3 is open and the slave 3300_3 latches the signal.

For example, in scenario 4, 5200_AOI_1 and 5200_AOI_2 are collectively implemented by at least three transistors: 3200_4_1, 3200_4_2 and 3200_4_3, where the master lower transistor 3200_4_3 is shared and is a CFT; 5300_OAI_1 and 5300_OAI_2 are collectively implemented by at least three transistors: 3300_4_1, 3300_4_2 and 3300_4_3, where the slave upper transistor 3300_4_1 is shared and is a CFT. Similar to the discussion earlier, when the clock signal is high, the slave 3300_4 is open, and the master 3200_4 latches the signal; when the clock signal is low, the master 3200_4 is open and the slave 3300_4 latches the signal. CFT's are connected to the "clock" signal at the bottom. As illustrated in FIG. 13, they are both connected to CP 5500.

Figure 5B:
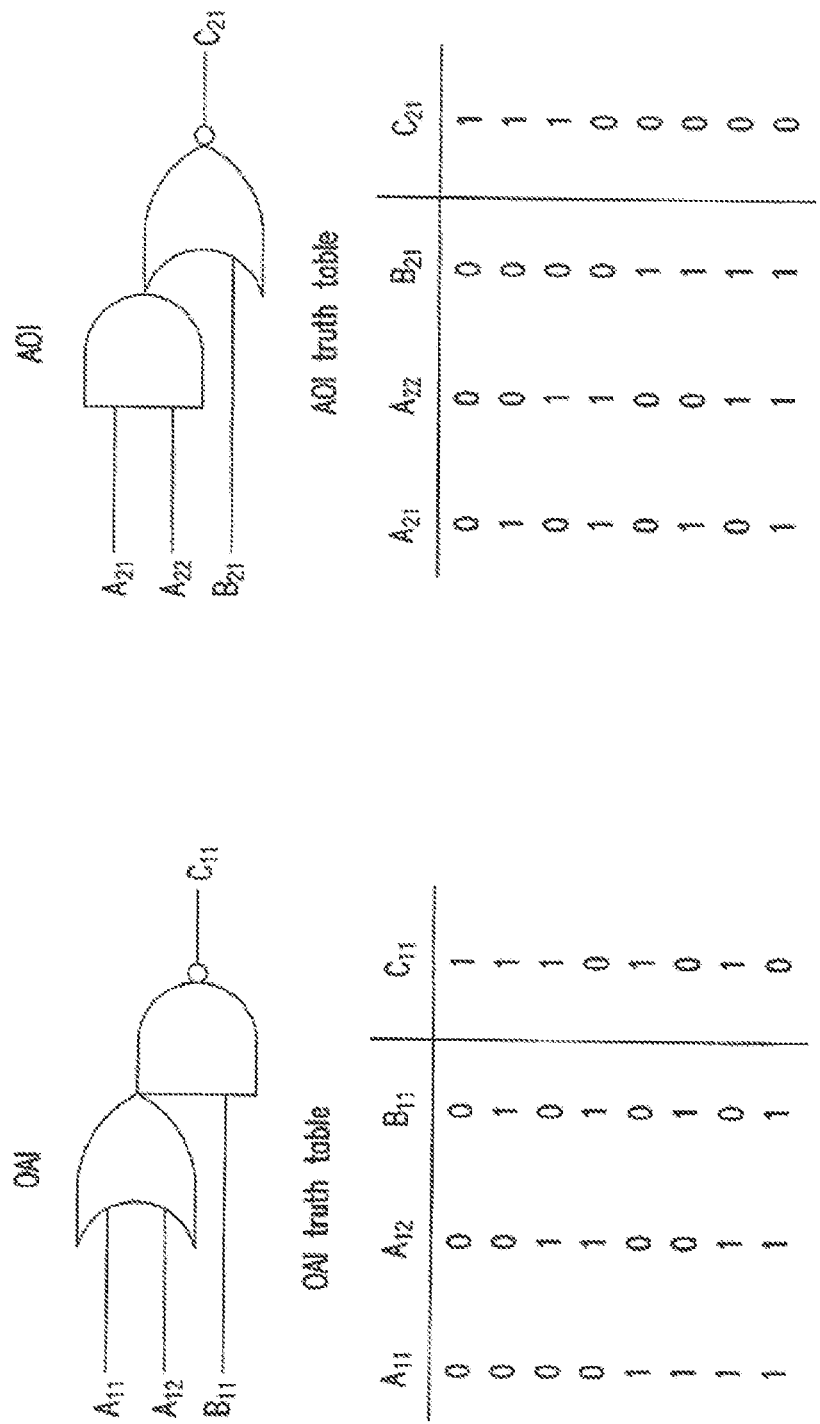
FIG. 5B illustrates exemplary circuit diagram of an OAI logic gate and an AOI logic gate, and the respective truth tables, according to the exemplary embodiment.

FIG. 5B illustrates exemplary circuit diagram of an OAI logic gate and an AOI logic gate, and the respective truth tables, according to the exemplary embodiment. Referring to FIG. 5B, an OAI and an AOI, and their respective truth tables (OAI truth table and AOI truth table) are shown, according to some embodiments. In some embodiments, the OAI's (3200_OAI_1 and 3200_OAI_2) of the master latch circuit 3200 in FIG. 5A each has a substantially similar functionality to the OAI in FIG. 5B. Accordingly, each of the OAI's (3200_OAI_1 and 3200_OAI_2) can use the corresponding truth table as shown in FIG. 5B (i.e., the "OAI truth table") to perform the above-mentioned OAI logic function. Similarly, the AOI's (3300_AOI_1 and 3300_AOI_2) of the slave latch circuit 3300 each has a substantially similar functionality to the AOI in FIG. 5B. Thus each of the AOI's (3300_AOI_1 and 3300_AOI_2) can use the truth table as shown in FIG. 5B (i.e., the "AOI truth table") to perform the above-mentioned AOI logic function. More specifically, according to some embodiments, the OAI 3200_OAI_1 can use the signal 3201 as A11, the clock signal CP 3308 as A12, and the signal 3304 as B11, and output C11 as the signal 3303, wherein a logical state of the signal 3303 is determined by the OAI truth table and a combination of logical states of the signals 3308, 3201 and 3304. For example, when the logical states of the signals 3308, 3201 and 3304 are at a logical "1", a logical "0" and a logical "1" respectively, according to the OAI truth table, the signal 3304 is at a logical state "0". The OAI 3200_OAI_2 can use the signal 3202 as A11, the clock signal 3308 as A12, and the signal 3303 as B11, and output C11 as the signal 3304, wherein a logical state of the signal 3304 is determined by the OAI truth table and a combination of logical states of the signals 3308, 3202 and 3303. Similarly, the AOI 3300_AOI_1 can use the signal 3303 as A21, the clock signal 3308 as A22, and the signal 3306 as B21, and output C21 as the signal 3305, wherein a logical state of the signal 3305 is determined by the AOI truth table and a combination of logical states of the signals 3308, 3303 and 3306; the AOI 3300_AOI_2 can use the signal 3304 as A21, the clock signal 3308 as A22, and the signal 3305 as B21, and output C21 as the signal 3306, wherein a logical state of the signal 3306 is determined by the AOI truth table and a combination of logical states of the signals 3308, 3304 and 3305.

According to some embodiments, by using the OAI (3200_OAI_1 and 3200_OAI_2) and AOI (3300_AOI_1 and 3300_AOI_2) in a scan flip-flop circuit 3000, the clock signal 3308 of the scan flip-flop circuit 3000 can be commonly implemented by the OAI's (3200_OAI_1 and 3200_OAI_2) and AOI's (3300_AOI_1 and 3300_AOI_2), respectively. As such, a logically inverted clock signal and corresponding components (e.g., one or more inverters) used to generate such a logically inverted clock signal may not be needed, which may advantageously reduce power consumption and design complexity of the scan flip-flop circuit 3000. In addition, as shown in FIG. 5A, the cross-coupled 3200_OAI_1 and 3200_OAI_2 are symmetric, and the cross-coupled 3300_AOI_1 and 3300_AOI_2 are also symmetric to each other. By implementing such a symmetric design of the cross-coupled OAI's and AOI's of the flip-flop circuit 3000, the number of transistors used to implement the OAI's and AOI's can be substantially reduced compared to the conventional scan flip-flop circuit that implements transmission gates. The reduced number of transistors can further reduce power consumption and design complexity of the scan flip-flop circuit 3000, which will be discussed in further detail below.

Figure 6:
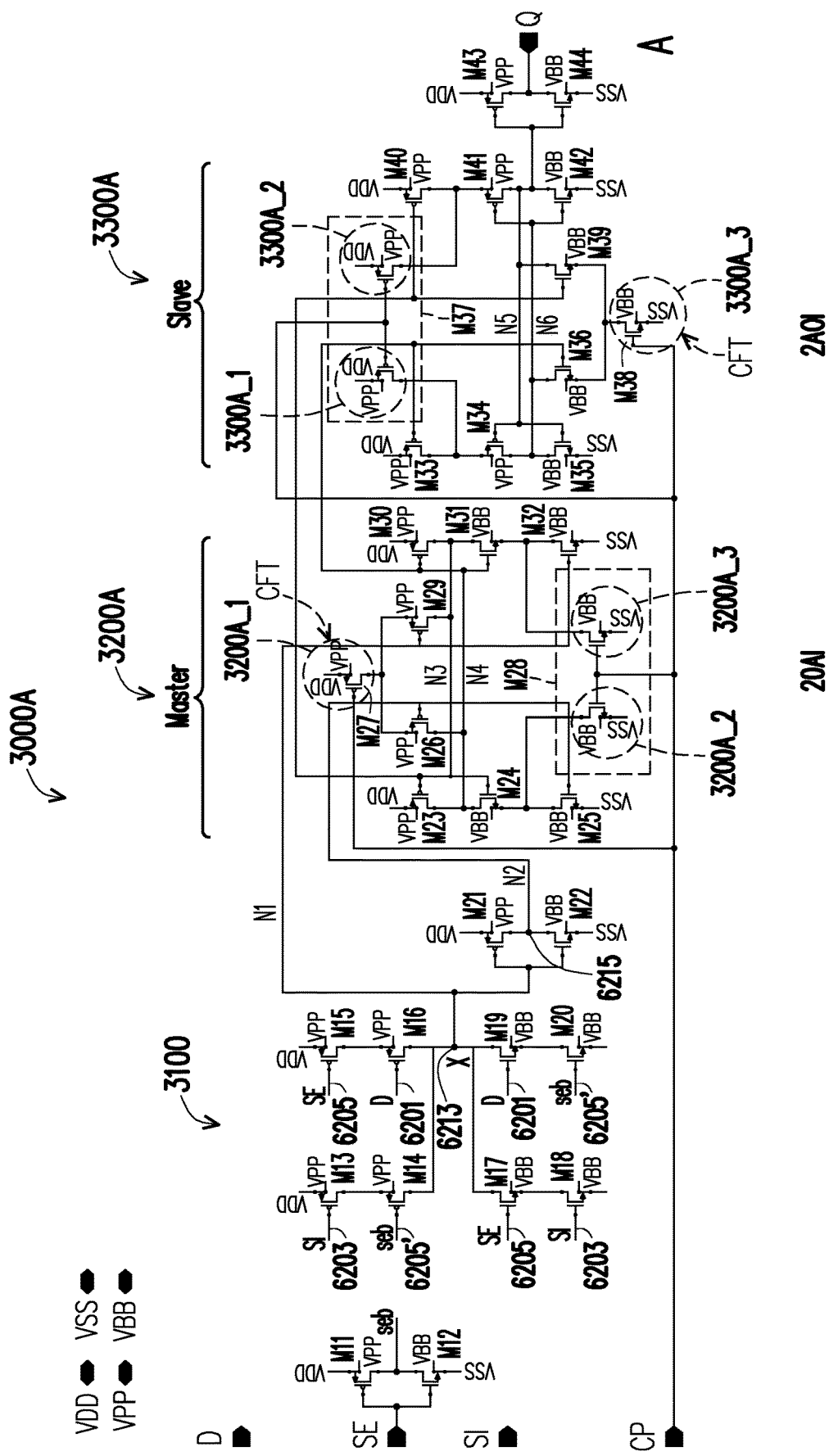
FIG. 6 is a transistor-level circuit diagram of the master-slave block corresponding to the circuit in FIG. 5, according to the exemplary embodiment.
Figure 7:
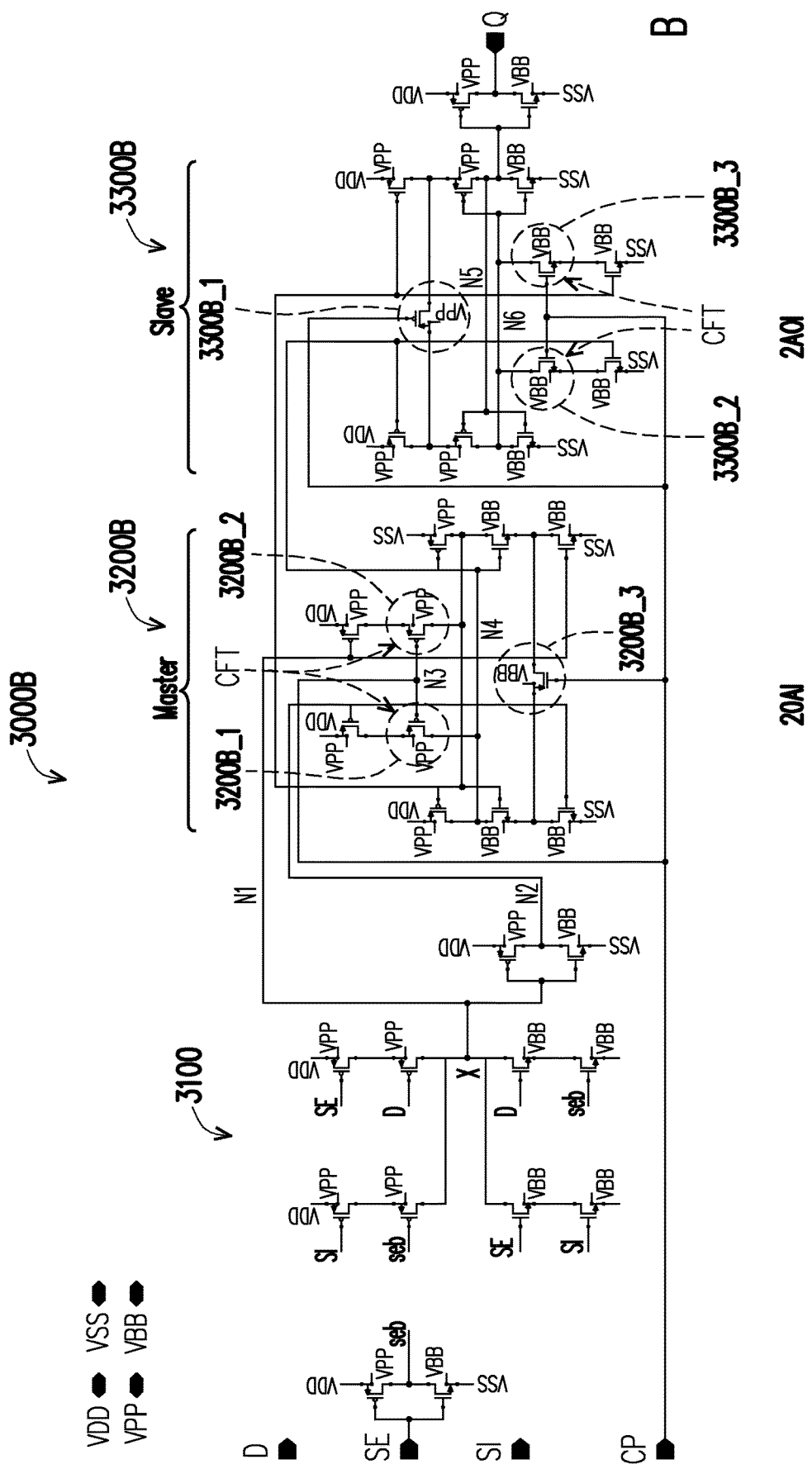
FIG. 7 is another transistor-level circuit diagram of the master-slave block corresponding to the circuit in FIG. 5, according to the exemplary embodiment.

FIG. 6 is a transistor-level circuit diagram of the master-slave block corresponding to the circuit in FIG. 5A, according to the exemplary embodiment. FIG. 7 is another transistor-level circuit diagram of the master-slave block corresponding to the circuit in FIG. 5A, according to the exemplary embodiment. The master 3200A and slave 3300A in FIG. 6 are identical to the scenario 2 in FIG. 3. The master 3200B and slave 3300B in FIG. 7 are identical to the scenario 1 in FIG. 3.

As shown in FIG. 5A, each of the gate-level components (3110, 3120, 3210, 3200_OAI_1, 3200_OAI_2, 3300_AOI_1, 3300_AOI_2 and 3310) of the scan flip-flop circuit 3000 can be implemented by one or more transistors. It is understood that the circuit diagrams shown in FIGS. 6 and 7 are merely examples to implement the gate-level components of the scan flip-flop circuit 3000. Each of the gate-level components of the scan flip-flop circuit 3000 can be implemented by any of a variety of circuit designs while remaining within the scope of the present disclosure.

According to some embodiments, the first inverter 3110 in FIG. 5A, is implemented by transistors M11 and M12 in FIG. 6 that are connected in series between a first supply voltage 6200-1 (e.g., Vdd) and a second supply voltage 6200-2 (e.g., ground). For brevity, the first and second supply voltages 6200-1 and 6200-2 are hereinafter referred to as Vdd and ground, respectively. According to some embodiments, the transistor M11 includes a p-type metal-oxide-semiconductor (PMOS) transistor (hereinafter "PMOS"), and the transistor M12 includes an n-type metal-oxide-semiconductor (NMOS) transistor (hereinafter "NMOS"). In addition, gates of the transistors M11 and M12 are commonly coupled to the scan enable signal SE 6205, and a common node, coupled to respective drains of the transistors M11 and M12, is configured to provide signal 6205' that is logically inverted to the scan enable signal SE 6205.

According to some embodiments, the multiplexer 3120 in FIG. 5A is implemented by transistors M13, M14, M15, M16, M17, M18, M19 and M20 in FIG. 6. More specifically, transistors M13 and M14 are connected in series between Vdd and a common node X, transistors M15 and M16 are connected in series between Vdd and the node X, transistors M17 and M18 are connected in series between the node X and ground; transistors M19 and M20 are connected in series between the node X and ground. According to some embodiments, gates of the serially connected transistors M13 and M14 are configured to receive signals 6203 and 6205' respectively; gates of the serially connected transistors M15 and M16 are configured to receive signals 6205 and 6201, respectively; gates of the serially connected transistors M11 and M12 are configured to receive signals 6205 and 6203, respectively; gates of the serially connected transistors M19 and M20 are configured to receive signals 6201 and 6205' respectively. According to some embodiments, transistors M13, M14, M15 and M16 each includes a PMOS; and transistors M11, M12, M19, and M20 each includes an NMOS. By implementing the multiplexer 3120 (in FIG. 5A) in accordance with such a circuit design described above, the multiplexer 3120 can selectively couple either the signal 6201 or the signal 6203 to the node X as the signal 6213 based on the logical state of the scan enable signal SE 6205, as described above.

Similar to the first inverter 3110, the second inverter 3210 is also implemented as a pair of serially coupled transistors M21 and M22. According to some embodiments, the transistors M21 and M22 are coupled between Vdd and ground. The transistor M21 includes a PMOS, and the transistor M22 includes an NMOS. Gates of the transistors M21 and M22 are commonly coupled to the node X so as to receive the single 6213, and drains of the transistors M21 and M22 are coupled to a common node so as to provide the signal 6215 that is logically inverted to the signal 6213.

According to some embodiments, the master latch circuit 3200A includes transistors M23, M24, M25, M26, M27, M28, M29, M30, M31 and M32, More specifically, the OAI 3200_OAI_2 of the master latch circuit 3200 can be formed by the transistors M23, M24, M25, M26, M27 and M28; and the OAI 3200_OAI_1 of the master latch circuit 3200A may be formed by the transistors M27, M28, M29, M30, M31 and M32. According to some embodiments, M27 is maintained as a single master upper transistor 3200_A_1 (CFT), while M28 is further split into two transistors 3200A_2 and 3200A_3. As discussed above, by splitting only one of M27 and M28 into two transistors to maintain six transistors implementing the gates, both total power consumption and total leakage power are minimized.

Similarly, according to some embodiments, the slave latch circuit 3300A includes transistors M33, M34, M35, M36, M37, M38, M39, M40, M41 and M42. More specifically, the 3300_AOI_2 of the slave latch circuit 3300 can be formed by the transistors M33, M34, M35, M36, M37 and M38; and the 3300_AOI_1 of the slave latch circuit 3300 can be formed by the transistors M37, M38, M39, M40, M41 and M42. According to some embodiments, M38 is maintained as a single slave lower transistor 3300_A_3 (CFT), while M37 is further split into two transistors 3300A_1 and 3300A_2. As discussed above, by splitting only one of M37 and M38 into two transistors to maintain six transistors implementing the gates, both total power consumption and total leakage power are minimized. In FIG. 7, the master upper transistor pair (3200B_1 and 3200B_2) are CFT's, and the slave lower transistor pair (3300B_2 and 3300B_3) are CFT's.

Figure 8:
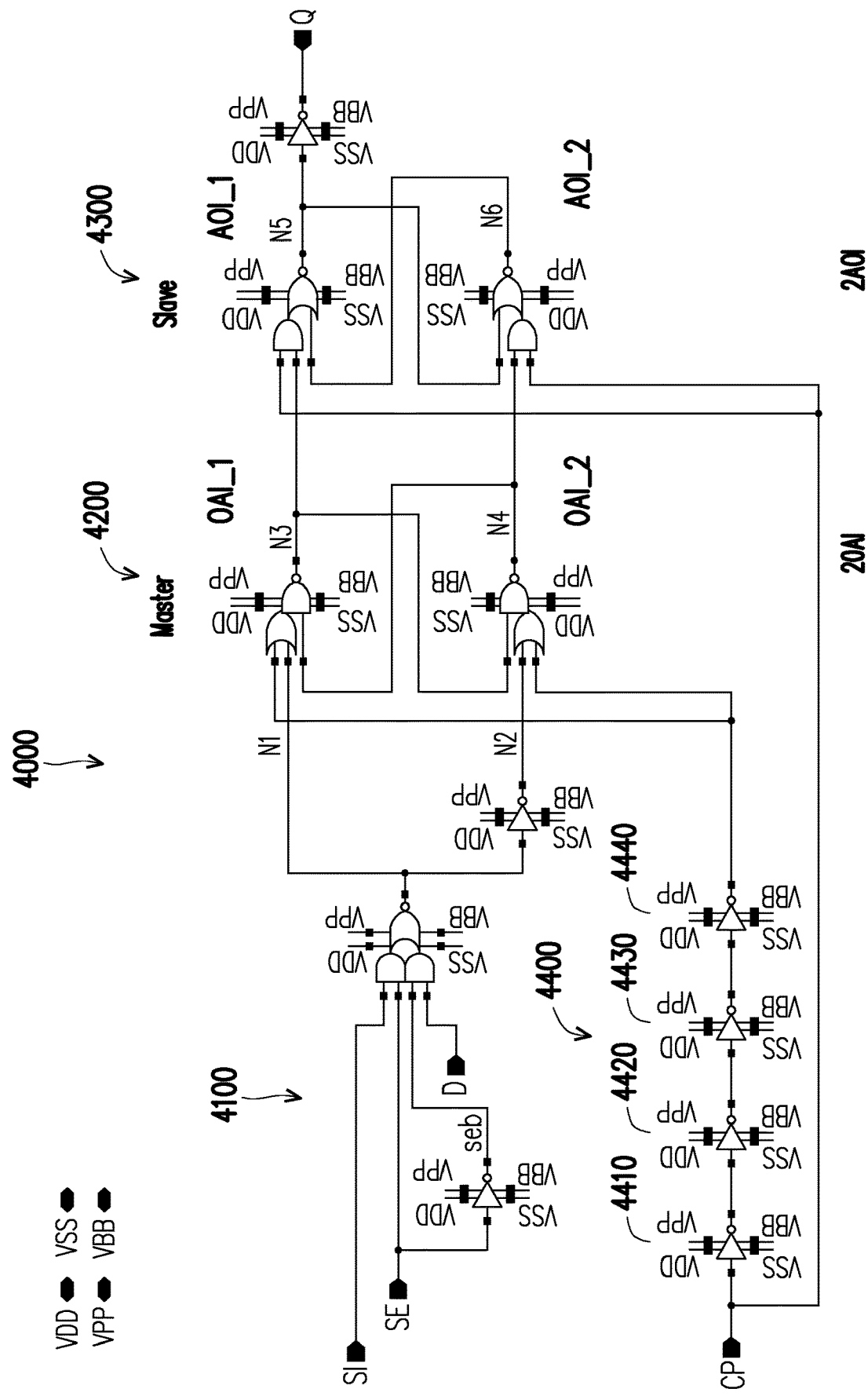
FIG. 8 is a gate-level circuit diagram of a master-slave block with time-borrowing, according to the exemplary embodiment.

FIG. 8 is a gate-level circuit diagram of a master-slave block with time-borrowing according to the exemplary embodiment. FIG. 8 is implemented based on FIG. 5A by adding a time borrowing circuit 4400 which includes inverters 4410, 4420, 4430 and 4440. According to some embodiments, the inverters 4410, 4420, 4430 and 4440 are serially coupled to one another. FIG. 8 illustrates 4 serially coupled inverters, but other even number can be used, for example, 2, 6, 8, etc. According to some embodiments, the inclusion of the time-borrowing circuit 4400 in the scan flip-flop circuit 4000 can delay the clock signal CP to be received by the master latch circuit 4200 by a number of gate delays that corresponds to a number of the inverters included in the time-borrowing circuit 4400, while the slave latch circuit 4300 receives the clock signal CP without a delay. According to some embodiments, delaying the clock signal CP to the master latch circuit 4200 can advantageously reduce the setup time of the scan flip-flop circuit 4000. More specifically, since the clock signal CP is delayed to be received by the master latch circuit 4200 and the clock signal CP is immediately received by the slave latch circuit 4300 without a delay, according to some embodiments, the slave latch circuit 4300 can provide a transparent window and release data earlier, which causes the master latch circuit 4200 to have more time for receiving input data during a current cycle, which in turn reduces the setup time.

Figure 9:
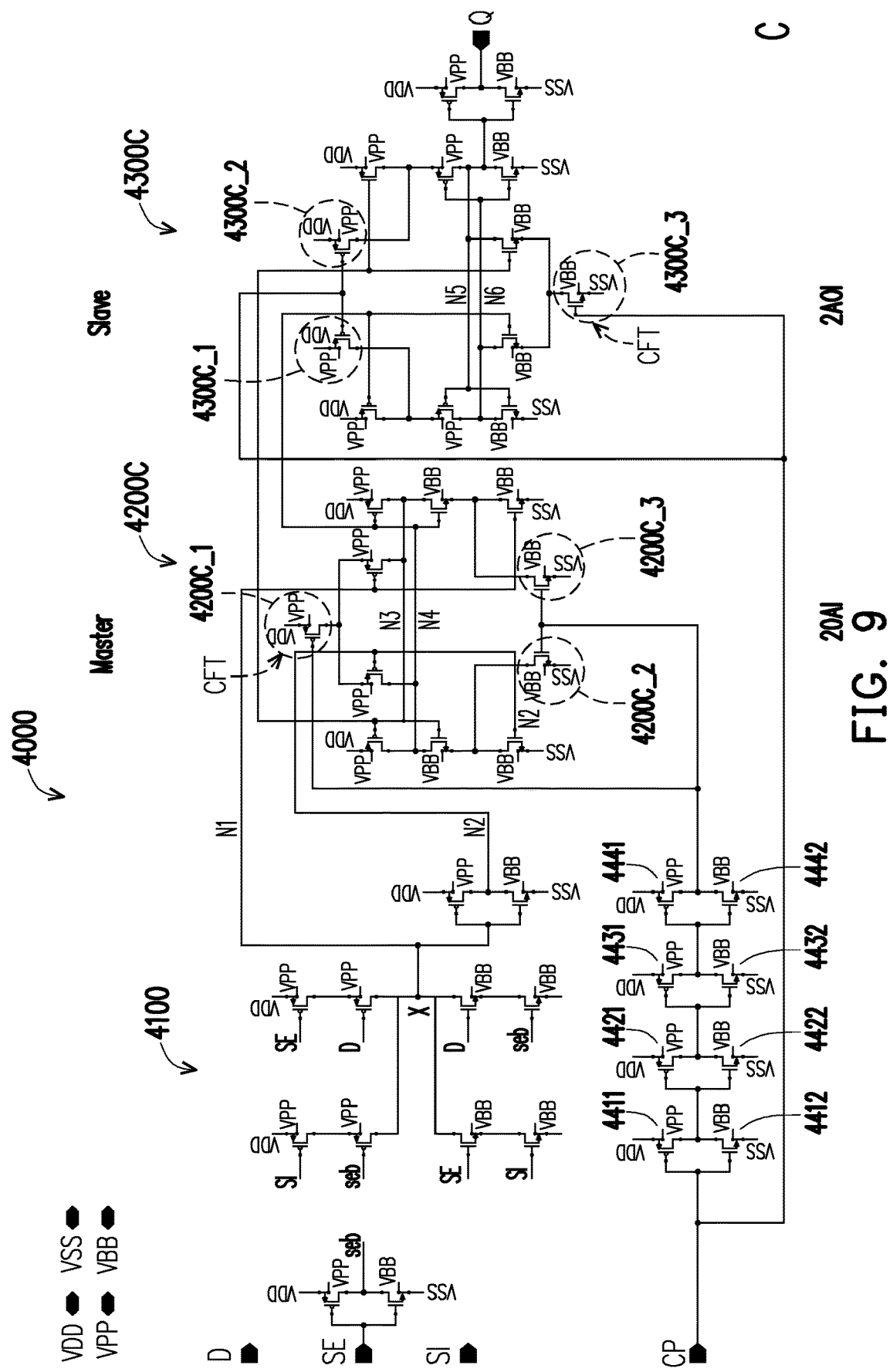
FIG. 9 is a transistor-level circuit diagram of the master-slave block with time-borrowing in FIG. 8, according to the exemplary embodiment.
Figure 10:
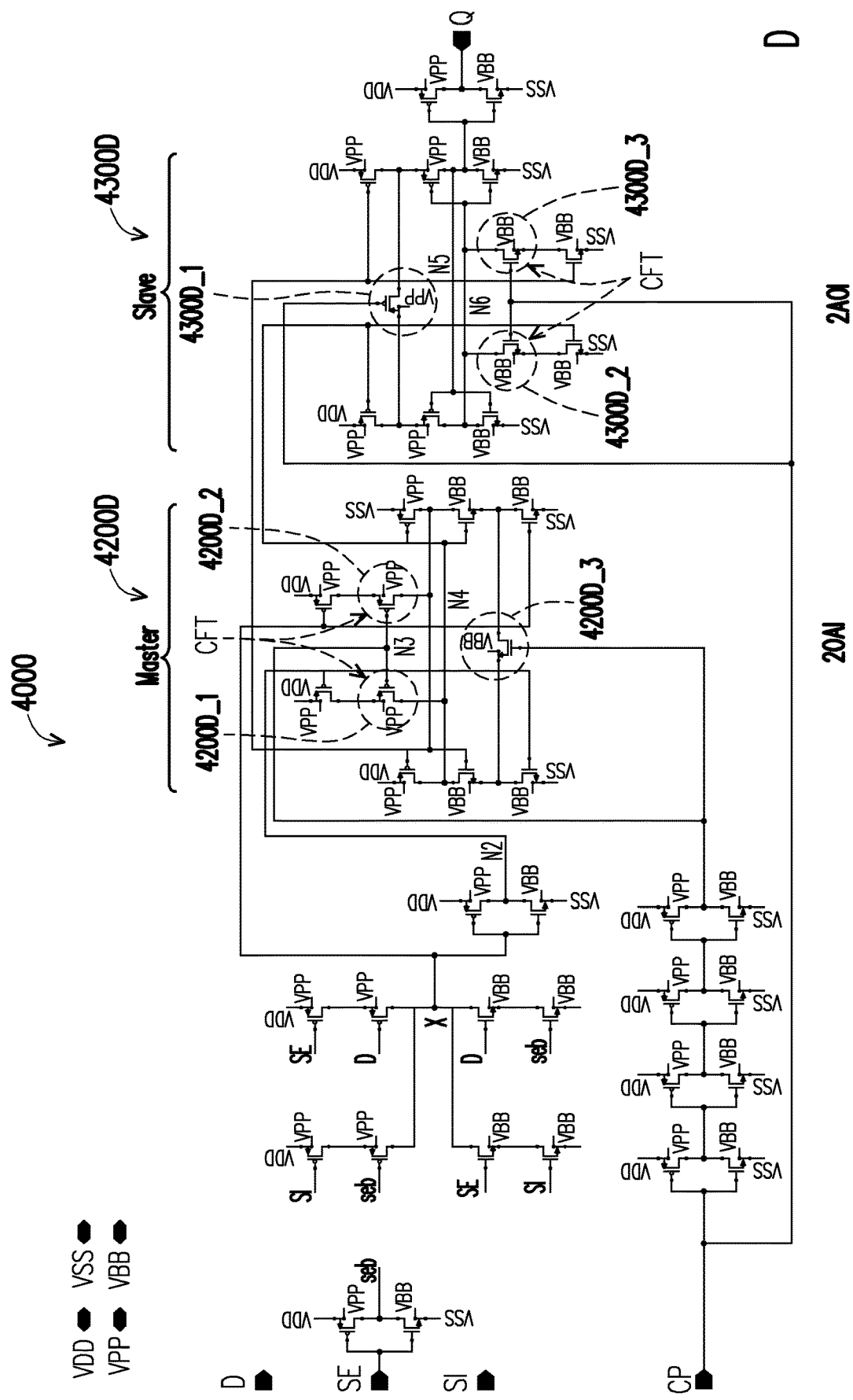
FIG. 10 is another transistor-level circuit diagram of the master-slave block with time-borrowing in FIG. 8, according to the exemplary embodiment.

FIG. 9 is a transistor-level circuit diagram of the master-slave block with time-borrowing in FIG. 8, according to the exemplary embodiment. FIG. 10 is another transistor-level circuit diagram of the master-slave block with time-borrowing in FIG. 8, according to the exemplary embodiment. Time borrowing element 4410 is implemented by two transistors 4411 and 4412; time borrowing element 4420 is implemented by two transistors 4421 and 4422; time borrowing element 4430 is implemented by two transistors 4431 and 4432; time borrowing element 4440 is implemented by two transistors 4441 and 4442. The remaining master and slave are implemented with similar transistor variations discussed in FIGS. 3 and 4, 6 and 7 above. The master and slave in FIG. 9 correspond to master and slave in FIG. 6, and FIG. 10 corresponds to FIG. 7.

Figure 11:
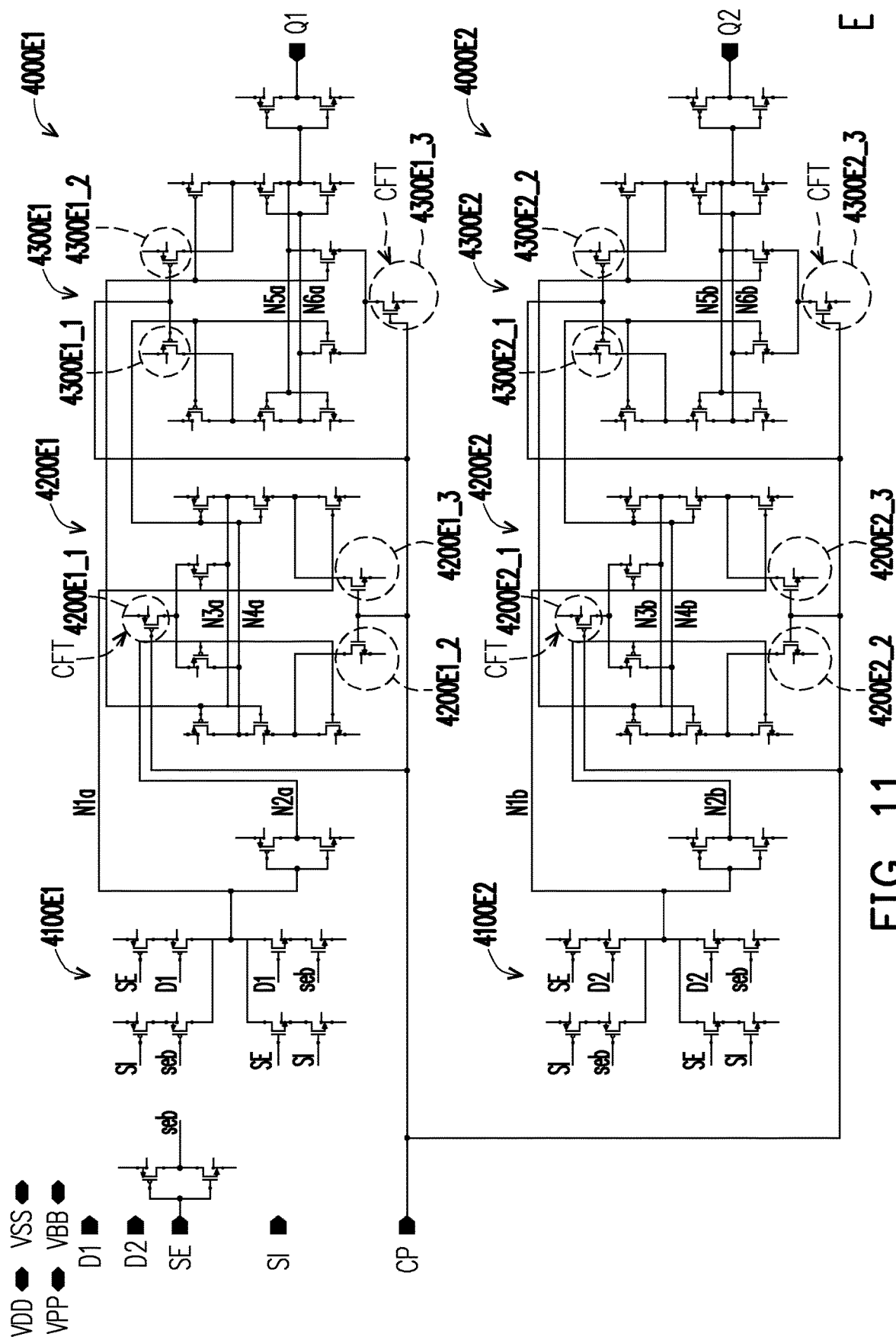
FIG. 11 is a transistor-level circuit diagram of a multi-bit flip-flop, according to an exemplary embodiment.

FIG. 11 is a transistor-level circuit diagram of a multi-bit flip-flop according to an exemplary embodiment. According to some embodiments, 4000E1 is the first bit flip-flop and 4000E2 is the second bit flip-flop, 4000E2 is a duplicate of 4000E1, the master 4200E1 and slave 4300E1 correspond to the configuration in FIG. 6, master 4200E2 and slave 4300E2 are duplicates of 4200E1 and slave 4300E1. The multi-bits 4000E1, 40000E2, 4000E3, . . . 4000EN are each a duplicate of 3000A in FIG. 6.

Figure 12:
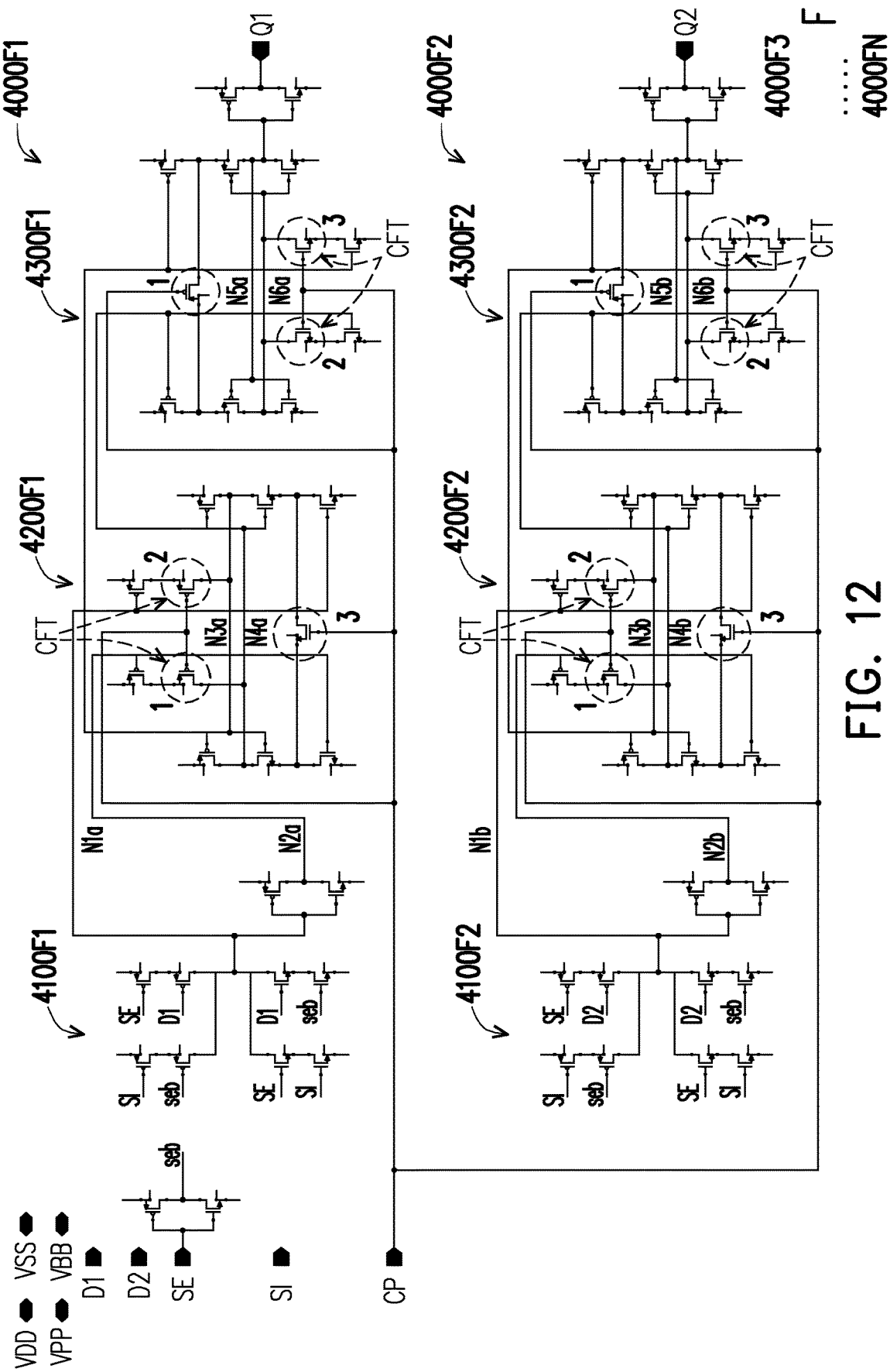
FIG. 12 is another transistor-level circuit diagram of a multi-bit flip-flop, according to the exemplary embodiment.

FIG. 12 another transistor-level circuit diagram of a multi-bit flip-flop according to the exemplary embodiment. According to some embodiments, 4000F1 is the first bit flip-flop and 4000F2 is the second bit flip-flop, 4000F2 is a duplicate of 4000F1, the master 4200F1 and slave 4300F1 correspond to the configuration in FIG. 7, master 4200F2 and slave 4300F2 are duplicates of 4200F1 and slave 4300F1. The multi-bits 4000F1, 40000F2, 4000F3, 4000FN are each a duplicate of 3000B in FIG. 7.

FIG. 13 is a gate-level circuit diagram of a master-slave block with local clock buffer according to the exemplary embodiment. According to some embodiments, FIG. 13 is based on FIG. 5 with the addition of a local clock buffer 5500 and by swapping the master 5200 and slave 5300 to account for clock inversion caused by the local clock buffer 5500. According to some embodiments, the local clock buffer 5500 is an inverter. The addition of the local clock buffer 5500 isolates the load 5000 from the clock distribution tree (not shown), and no buffer is needed inside the flip-flop cells 5200 and 5300. While as a comparison, in a conventional flip-flop, two additional buffers (internal inverters) are needed to generate clock and clock_bar signals for both the master and the slave. The swapping of master and slave to account for clock inversion avoids the need for an inverted clock inside the cells. The master 5200 and slave 5300 can be implemented with scenarios 1-4 in FIGS. 3 and 4 as discussed above.

Figure 14:
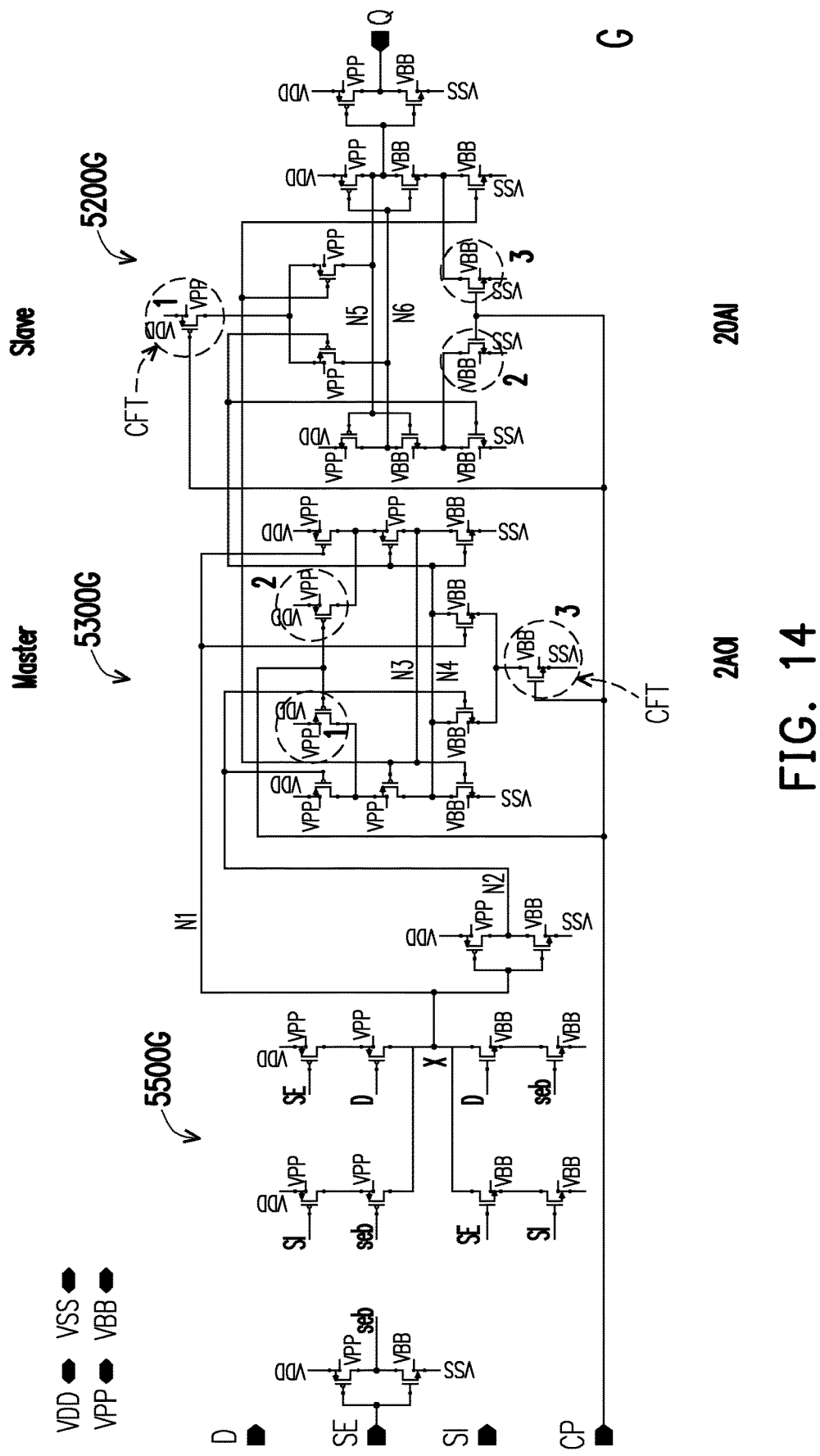
FIG. 14 is a transistor-level circuit diagram of the master-slave block with local clock buffer corresponding to FIG. 13, according to the exemplary embodiment.
Figure 16:
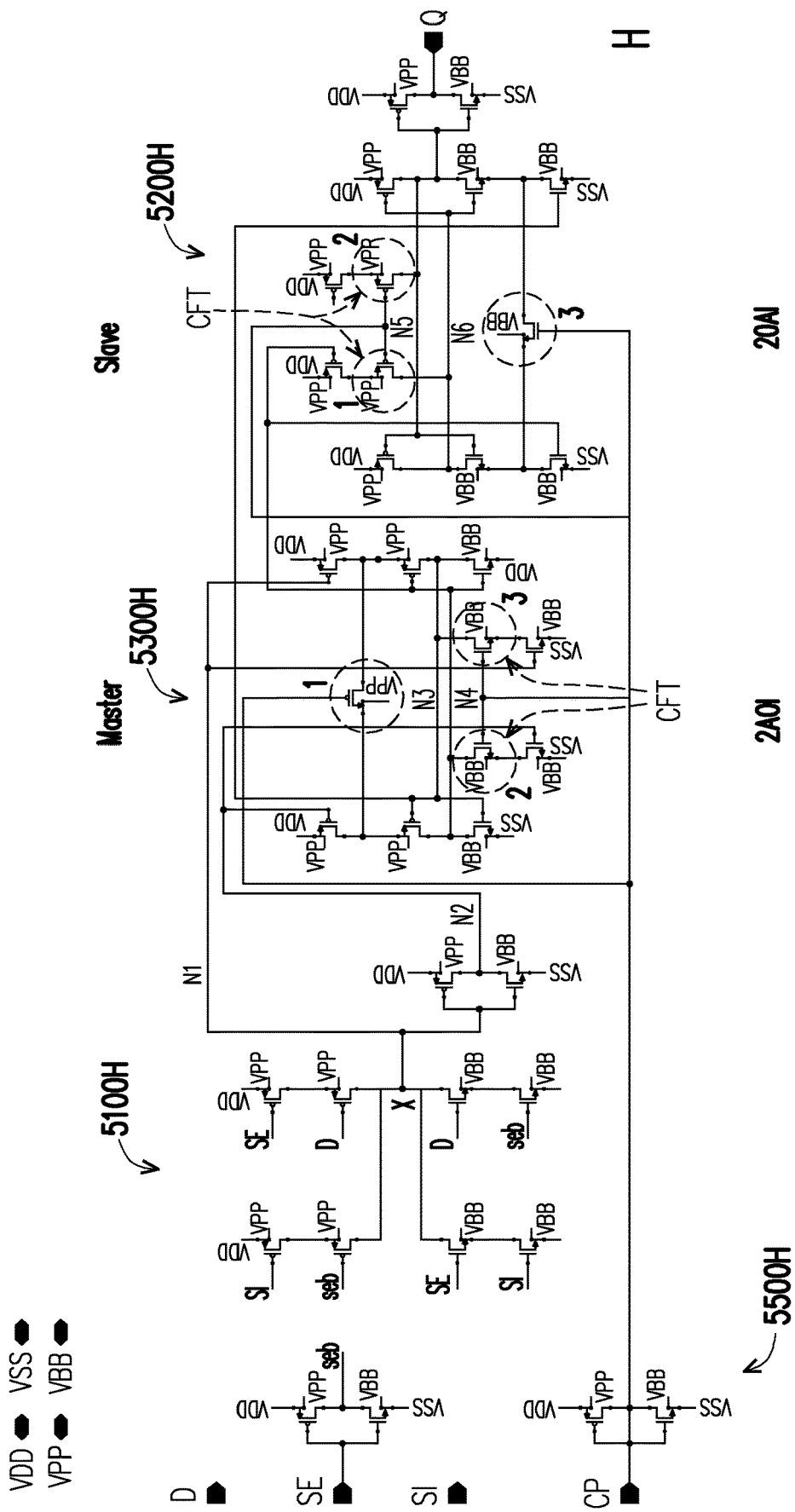
FIG. 16 is another transistor-level circuit diagram of the master-slave block with local clock buffer corresponding to FIG. 13, according to the exemplary embodiment.

FIG. 14 is a transistor-level circuit diagram of the master-slave block with local clock buffer corresponding to FIG. 13, according to the exemplary embodiment. FIG. 16 is another transistor-level circuit diagram of the master-slave block with local clock buffer corresponding to FIG. 13, according to the exemplary embodiment. The local time buffer 5500G can be an inverter which is implemented as a pair of transistors. As discussed above, the addition of an inverter 5500, the master and slave latch circuits can be swapped. In FIG. 14, the master 5300G and slave 5200G are implemented with the scenario 4 in FIG. 4. In FIG. 16, the master 5300H and slave 5200H are implemented with the scenario 3 in FIG. 4.

Figure 15:
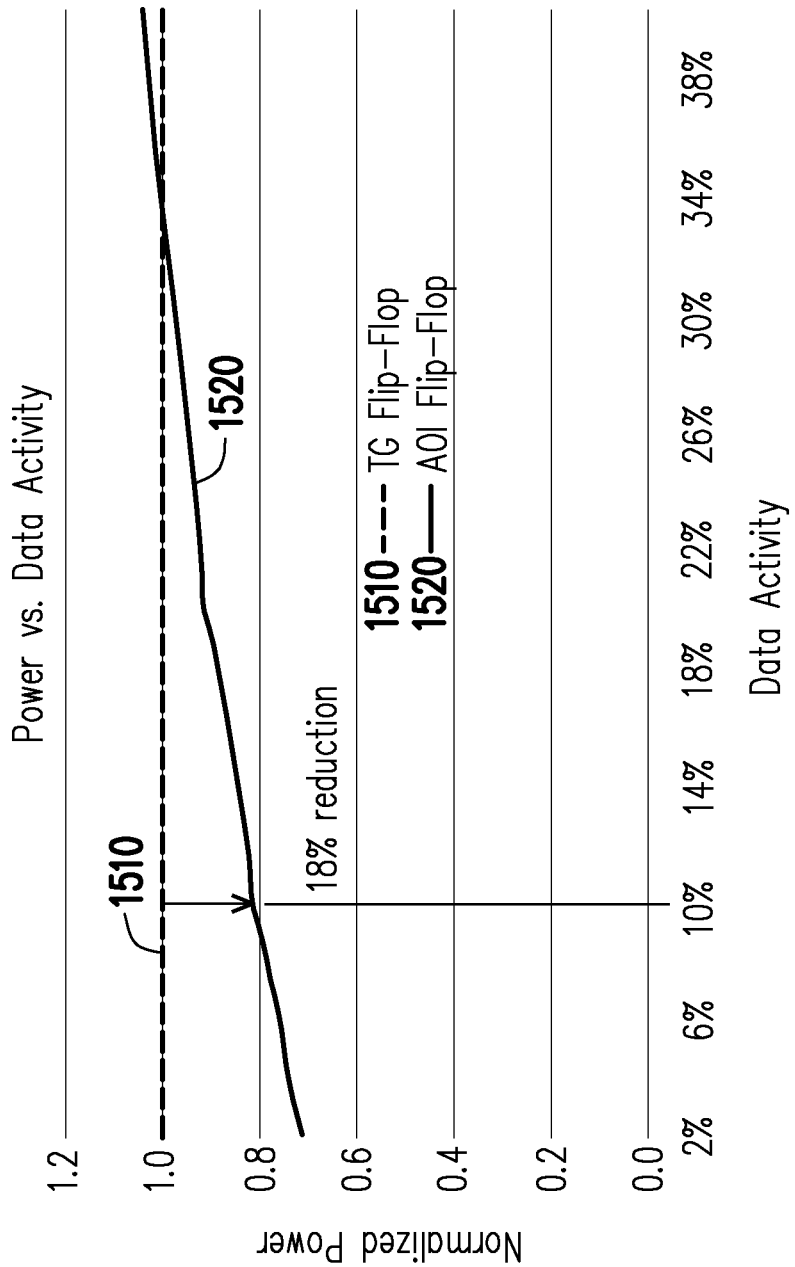
FIG. 15 is a figure showing the power consumption reduction of the transmission gate flop and AOI flop versus data activity, according to the exemplary embodiment.

FIG. 15 is a figure showing the power consumption reduction of the AOI versus data activity according to the exemplary embodiment. According to some embodiments, in FIG. 15, the horizontal axis is data activity, and the vertical axis is normalized power. The dashed line 1510 represent transmission gate flip-flop. The transmission gate flip-flop curve 1510 is almost constant valued at 1.0. In comparison, the AOI flip-flop 1520 increases from around 0.7 at 2% data activity to around 1.05 at 40% data activity. At 10% data activity, which is within or near the typical operating range of the gates, the difference between the 1510 and 1520 is approximately 18%, which means that the normalized power is reduced by 18%. According to some embodiments, the gates are designed to operate near or at the 10% data activity range to take advantage of the 18% normalized power reduction.

Figure 17:
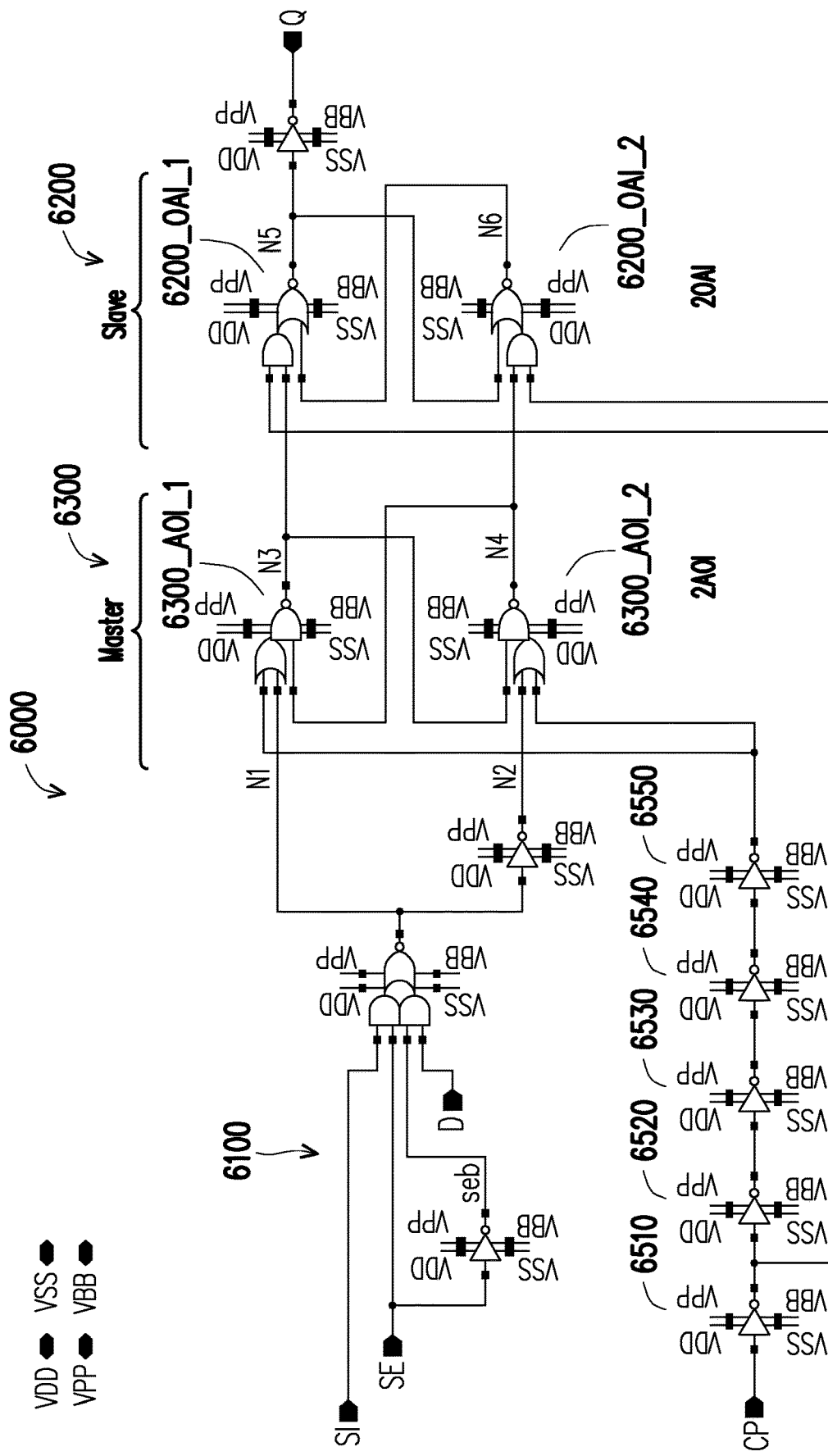
FIG. 17 is a gate-level circuit diagram of the mater-slave block with local clock buffer and time borrowing, according to the exemplary embodiment.
Figure 18:
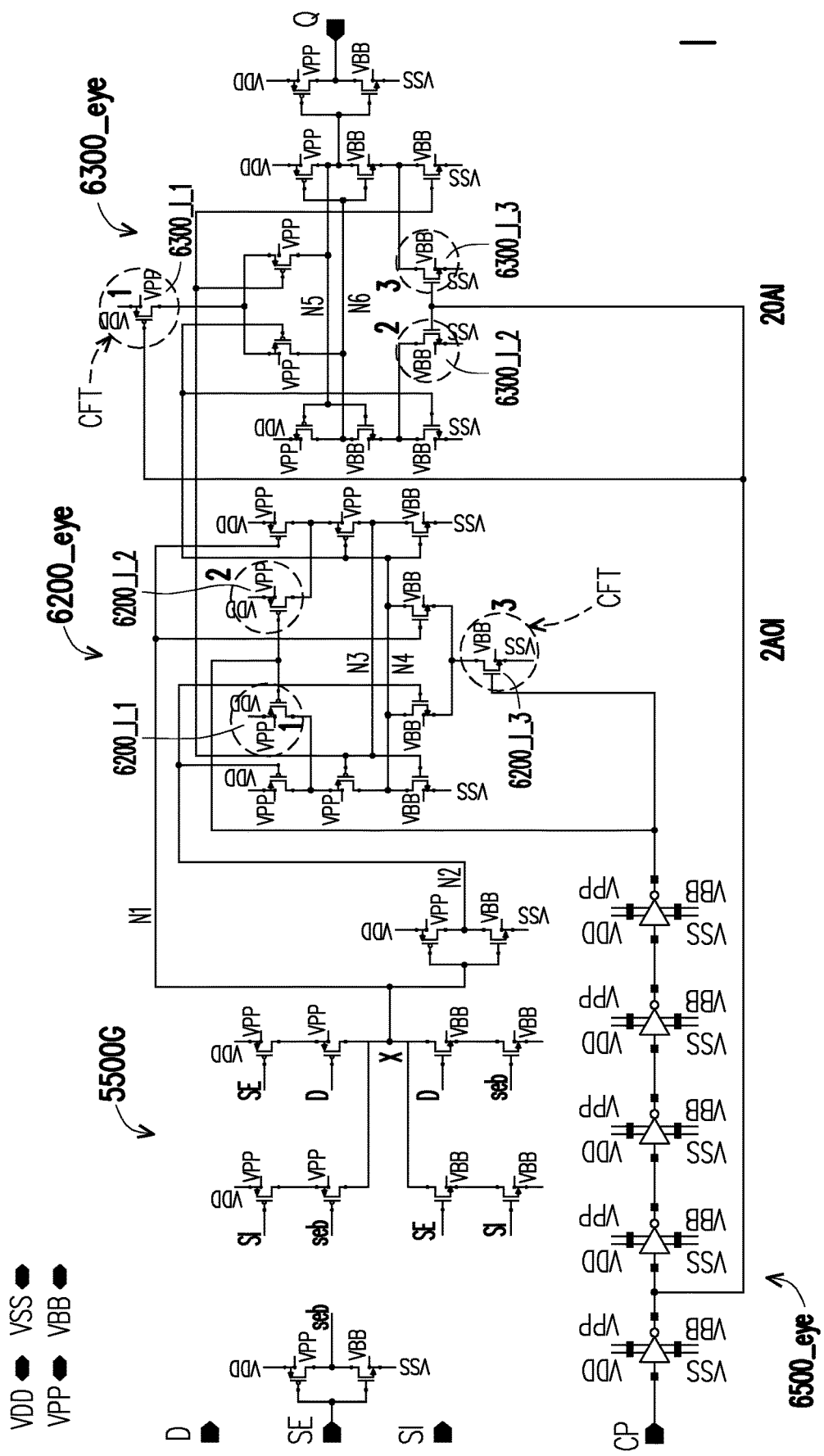
FIG. 18 is a transistor-level circuit diagram of the mater-slave block with local clock buffer and time borrowing corresponding to FIG. 17, according to the exemplary embodiment.
Figure 19:
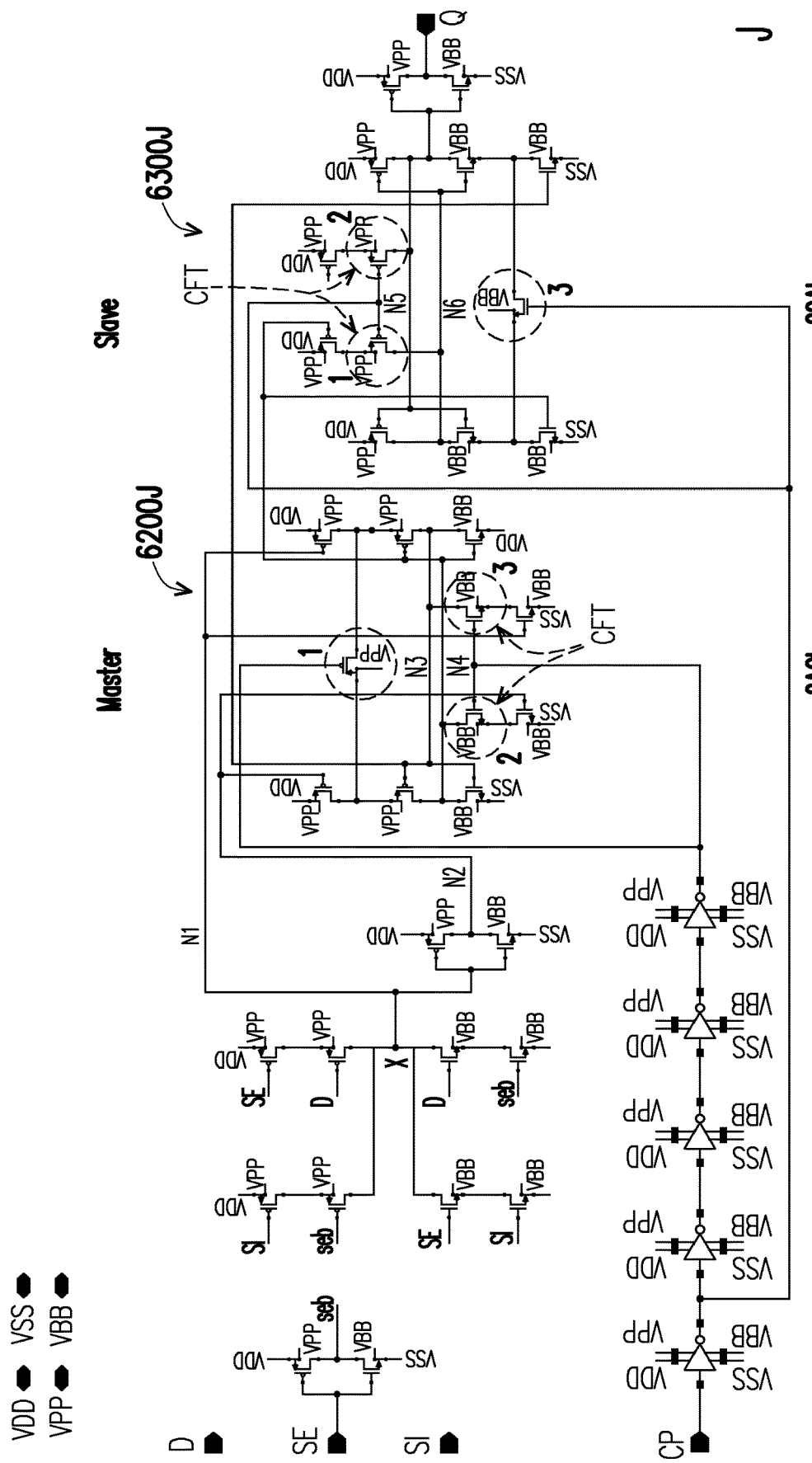
FIG. 19 is another transistor-level circuit diagram of the mater-slave block with local clock buffer and time borrowing corresponding to FIG. 17, according to the exemplary embodiment.

FIG. 17 is a gate-level circuit diagram of the mater-slave block with local clock buffer and time borrowing according to the exemplary embodiment. According to some embodiments, the circuit 6000 in FIG. 17 is based on circuit 3000 in FIG. 5 by adding a local clock buffer 6510 and four time borrowing units 6520, 6530, 6540 and 6550. In addition, similar to FIG. 13, the master 6300 and the slave 6200 are also swapped to account for clock inversion caused by the local clock buffer 6510. According to some embodiments, the setup time of the circuit 6000 is defined by the timing difference between SI and CP, or equivalently between D and CP, measured by clock cycles. The setup time of the circuit 6000 defines how early the input signal (either D or SI) needs to be stable before the clock signal (CP) changes. The addition of time borrowing units 6520, 6530, 6540 and 6550 helps to improve the setup time of the circuit 6000 by creating an open time overlap between the master 6300 and the slave 6200. The master 6300 and slave 6200 can be implemented with scenarios 1-4 in FIGS. 3 and 4 as discussed above FIG. 18 is a transistor-level circuit diagram of the mater-slave block with local clock buffer and time borrowing corresponding to FIG. 17, according to the exemplary embodiment. According to some embodiments, 6300_AOI_1 and 6300_AOI_2 in FIG. 17 correspond to 6300_I_1, 6300_I_2 and 6300_I_3. According to some embodiments, 6200_OAI_1 and 6200_OAI_2 in FIG. 17 correspond to 6200_I_1, 6200_I_2 and 6200_I_3 in FIG. 18. FIG. 19 is another transistor-level circuit diagram of the mater-slave block with local clock buffer and time borrowing corresponding to FIG. 17, according to the exemplary embodiment. The master 6200_I and slave 6300_I in FIG. 18 are implemented with scenario 1 in FIG. 3. The master 6200_7 and slave 6300_7 in FIG. 19 are implemented with scenario 2 in FIG. 3.

Figure 20:
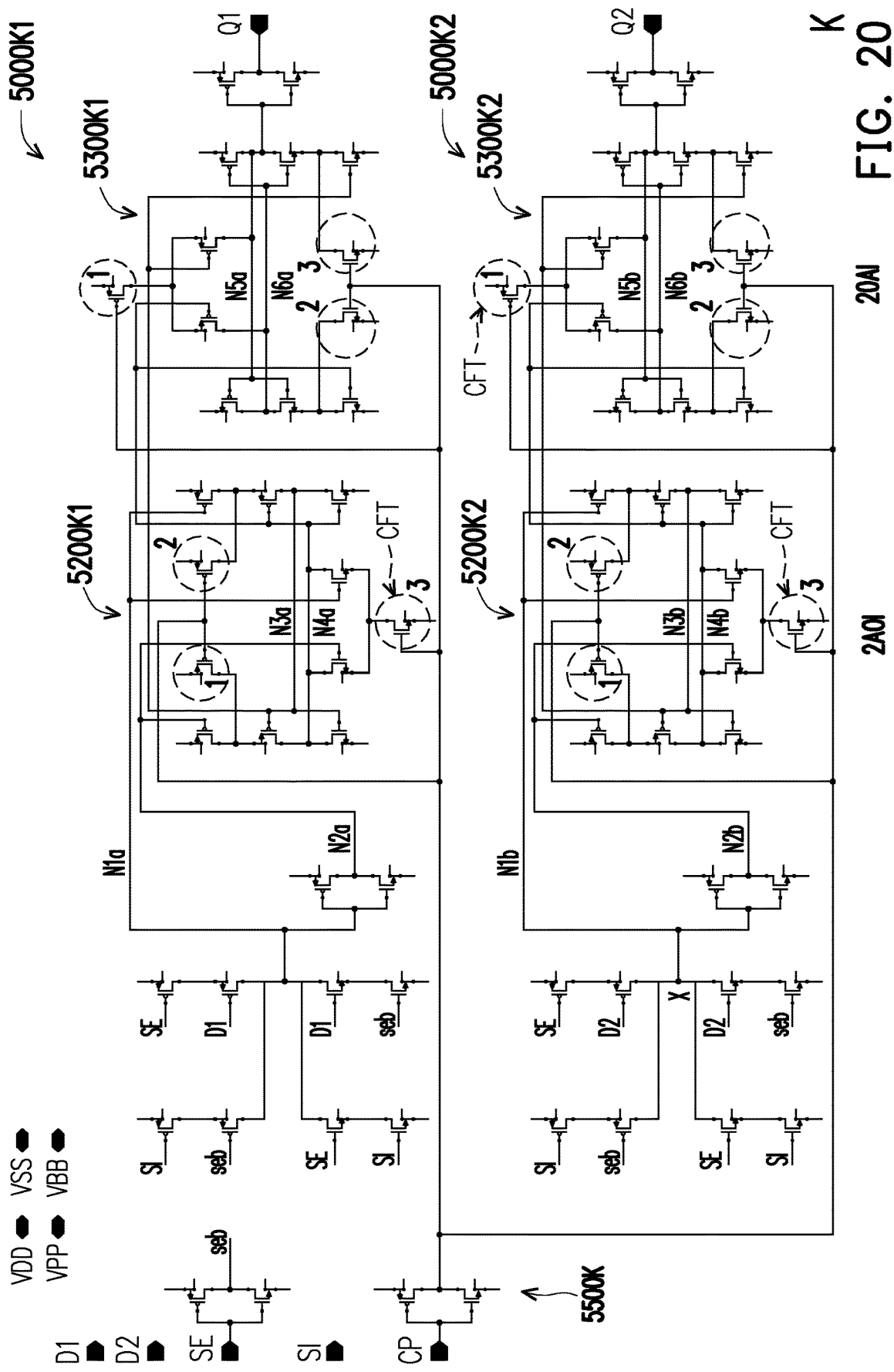
FIG. 20 is a transistor-level circuit diagram of a multi-bit flip-flop with local clock buffer, according to the exemplary embodiment.
Figure 21:
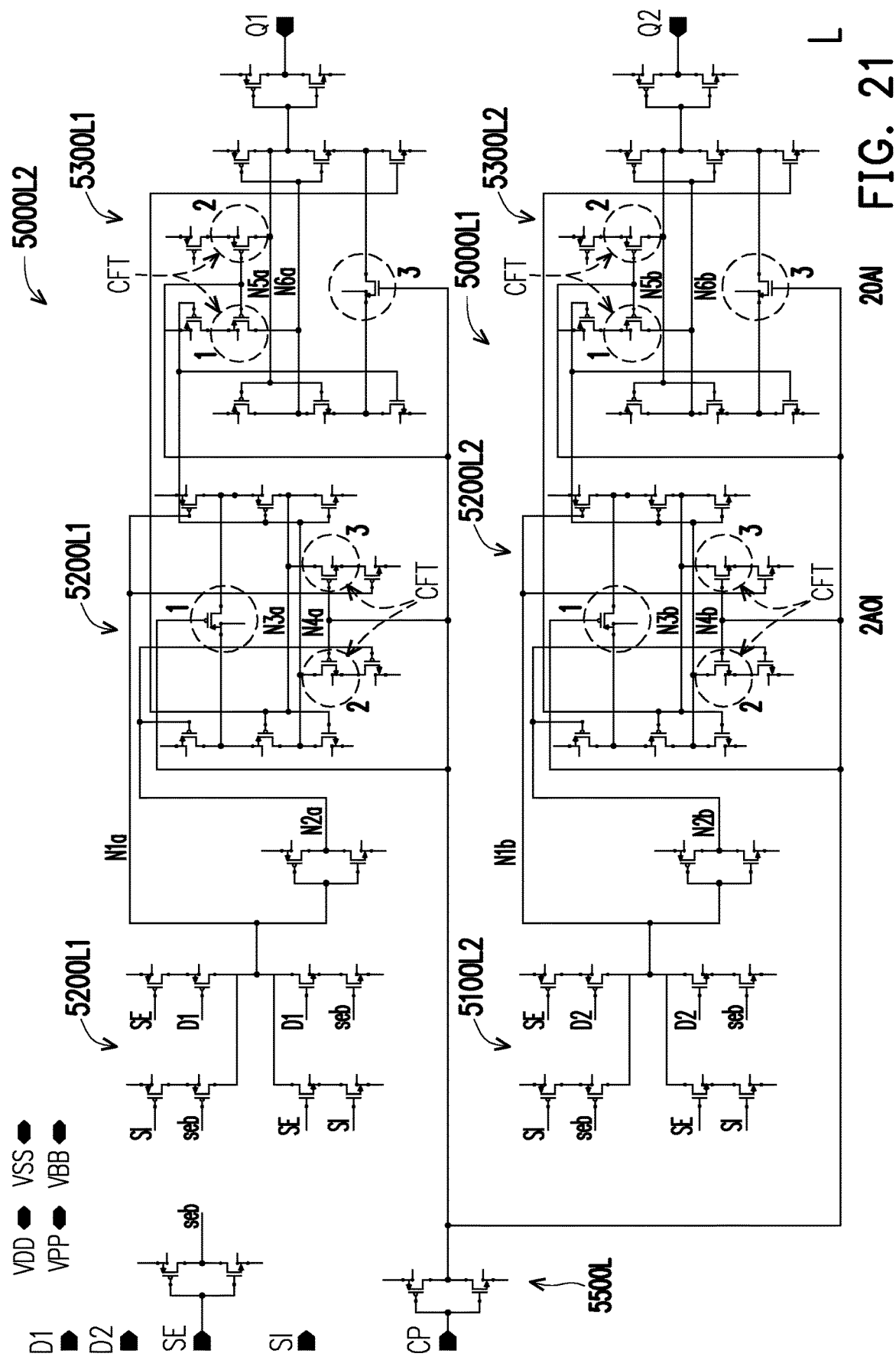
FIG. 21 is another transistor-level circuit diagram of a multi-bit flip-flop with local clock buffer, according to the exemplary embodiment.

FIG. 20 is a transistor-level circuit diagram of a multi-bit flip-flop with local clock buffer, according to the exemplary embodiment. FIG. 21 is another transistor-level circuit diagram of a multi-bit flip-flop with local clock buffer according to the exemplary embodiment. In FIG. 20, the first bit 5000K1, the second bit 5000K2 are duplicates of 3000B, the local clock buffer 5500K is added. In FIG. 21, the first bit 5000L1 and the second bit 5000L2 are duplicates of 3000A, the local clock buffer 5500L is added.

Figure 22:
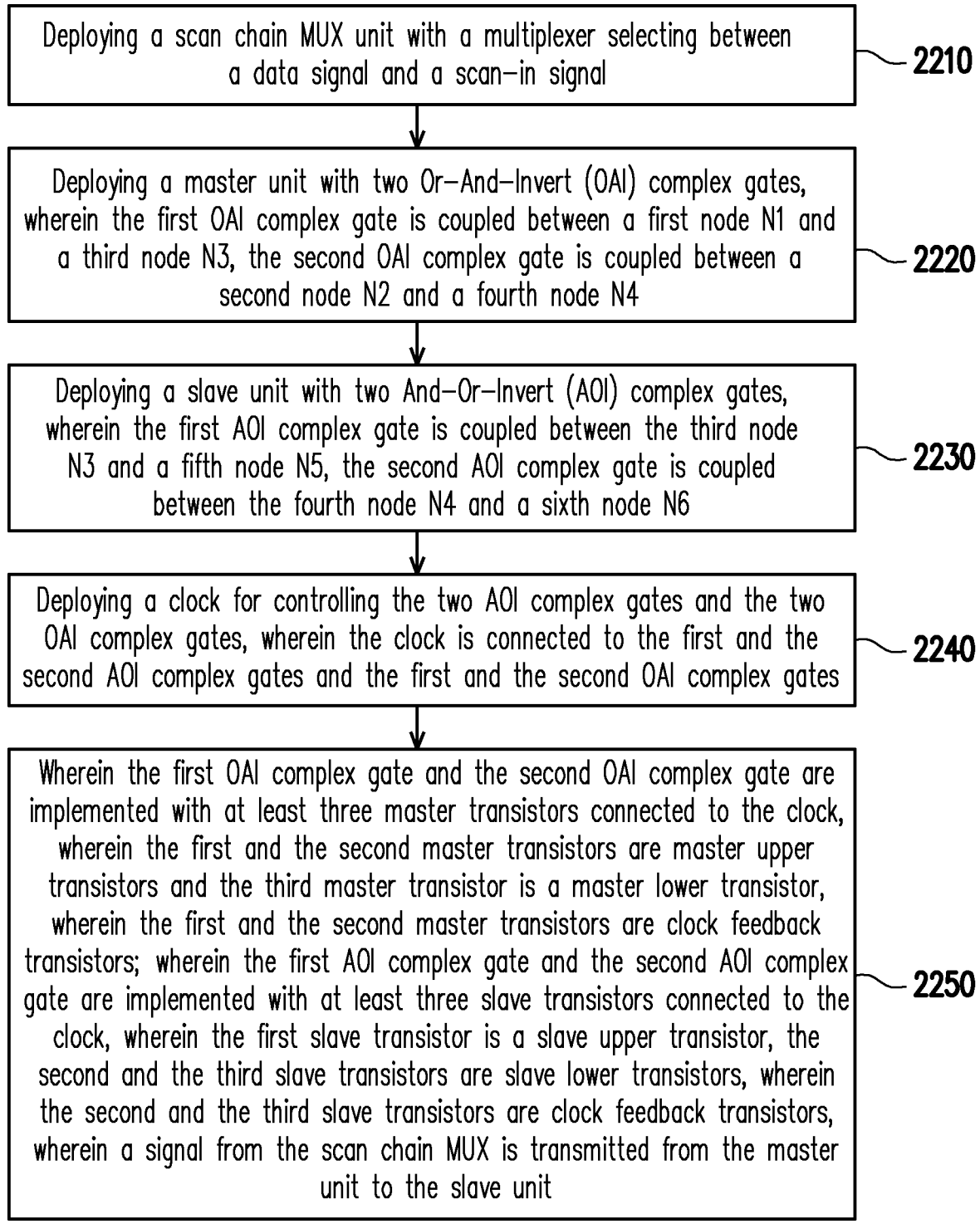
FIG. 22 is a flowchart illustrating a method for lowering flip-flop circuit power using AOI and OAI complex gates, according to the exemplary embodiment.

FIG. 22 is a flowchart illustrating a method for lowering flip-flop circuit power using AOI and OAI gates, according to the exemplary embodiment. According to some embodiments, the method for lowering flip-flop circuit power using AOI and OAI gates includes the first step 2210, deploying a MUX unit with a multiplexer selecting between a data signal (first signal) and a scan-in signal (second signal), the second step 2220, deploying a master unit with two Or-And-Invert (OAI) gates, wherein the first OAI complex gate is coupled between a first node N1 and a third node N3, the second OAI complex gate is coupled between a second node N2 and a fourth node N4, the third step 2230, deploying a slave unit with two And-Or-Invert (AOI) gates, wherein the first AOI gate is coupled between the third node N3 and a fifth node N5, the second AOI gate is coupled between the fourth node N4 and a sixth node N6, the fourth step 2240, deploying a clock for controlling the two AOI complex gates and the two OAI complex gates, wherein the clock is connected to the first and the second AOI complex gates and the first and the second OAI complex gates, and the fifth step 2250, wherein the first OAI complex gate and the second OAI complex gate are implemented with at least three master transistors connected to the clock, wherein the first and the second master transistors are master upper transistors and the third master transistor is a master lower transistor, wherein the first and the second master transistors are clock feedback transistors; wherein the first AOI complex gate and the second AOI complex gate are implemented with at least three slave transistors connected to the clock, wherein the first slave transistor is a slave upper transistor, the second and the third slave transistors are slave lower transistors, wherein the second and the third slave transistors are clock feedback transistors, wherein a signal from the MUX is transmitted from the master unit to the slave unit.

FIG. 23 is a flowchart illustrating another method for lowering flip-flop circuit power using AOI and OAI complex gates, according to the exemplary embodiment. According to some embodiments, the other method for lowering flip-flop circuit power using AOI and OAI complex gates includes the first step 2310, deploying a MUX unit with a multiplexer selecting between a data signal (first signal) and a scan-in signal (second signal), the second step 2320, deploying a master unit with two And-Or-Invert (AOI) complex gates, wherein the first AOI complex gate is coupled between a first node N1 and a third node N3, the second AOI complex gate is coupled between a second node N2 and a fourth node N4, the third step 2330, deploying a slave unit with two Or-And-Invert (OAI) complex gates, wherein the first OAI complex gate is coupled between the third node N3 and a fifth node N5, the second OAI complex gate is coupled between the fourth node N4 and a sixth node N6, the fourth step 2340, deploying a clock for controlling the two AOI complex gates and the two OAI complex gates, wherein the clock is connected to the first and the second AOI complex gates and the first and the second OAI complex gates, and the fifth step 2350, wherein the first AOI complex gate and the second AOI complex gate are implemented with at least three master transistors connected to the clock, wherein the first master transistor is a master upper transistor, the second and the third master transistors are master lower transistors, wherein the second and the third master transistors are clock feedback transistors; wherein the first OAI complex gate and the second OAI complex gate are implemented with at least three slave transistors connected to the clock, wherein the first and the second slave transistors are slave upper transistors, the third slave transistor is a slave lower transistor, wherein the first and the second slave transistors are clock feedback transistors, wherein a signal from the MUX is transmitted from the master unit to the slave unit.

According to some embodiments, a flip-flop circuit using And-Or-Invert (AOI) and Or-And-Invert (OAI) complex gates is disclosed. The circuit includes a MUX unit with a multiplexer selecting between a data signal (first signal) and a scan-in signal (second signal); a master unit with two Or-And-Invert (OAI) complex gates, the first OAI complex gate is coupled between a first node N1 and a third node N3, the second OAI complex gate is coupled between a second node N2 and a fourth node N4; a slave unit with two And-Or-Invert (AOI) complex gates, the first AOI complex gate is coupled between the third node N3 and a fifth node N5, the second AOI complex gate is coupled between the fourth node N4 and a sixth node N6; and a clock for controlling the two AOI complex gates and the two OAI complex gates, the clock is connected to the first and the second AOI complex gates and the first and the second OAI complex gates.

According to some embodiments, the first OAI complex gate and the second OAI complex gate are implemented with at least three master transistors connected to the clock, the first and the second master transistors are master upper transistors and the third master transistor is a master lower transistor, the first and the second master transistors are clock feedback transistors; the first AOI complex gate and the second AOI complex gate are implemented with at least three slave transistors connected to the clock, the first slave transistor is a slave upper transistor, the second and the third slave transistors are slave lower transistors, the second and the third slave transistors are clock feedback transistors, a signal from the MUX is transmitted from the master unit to the slave unit. According to some embodiments, the first OAI complex gate and the second OAI complex gate are implemented with at least three master transistors connected to the clock, the first master transistor is a master upper transistor, the second and the third master transistors are master lower transistors, the first master transistor is a clock feedback transistor; the first AOI complex gate and the second AOI complex gate are implemented with at least three slave transistors connected to the clock, the first and the second slave transistors are slave upper transistors, the third slave transistor is a slave lower transistor, the third slave transistor is a clock feedback transistor, a signal from the MUX is transmitted from the master unit to the slave unit.

According to some embodiments, the clock is directly connected to the first and the second AOI complex gates, the clock is connected to a non-zero even number of serially connected inverters for time borrowing and then connected to the first and the second OAI complex gates. According to some embodiments, the first AOI complex gate and the second AOI complex gate are implemented with at least three master transistors connected to the clock, wherein the first master transistor is a master upper transistor, the second and the third master transistors are master lower transistors, wherein the second and the third master transistors are clock feedback transistors; wherein the first OAI complex gate and the second OAI complex gate are implemented with at least three slave transistors connected to the clock, wherein the first and the second slave transistors are slave upper transistors, the third slave transistor is a slave lower transistor, wherein the first and the second slave transistors are clock feedback transistors, wherein a signal from the scan chain MUX is transmitted from the master unit to the slave unit. According to some embodiments, the clock is connected to a clock buffer and the clock buffer is connected to the first and the second AOI complex gates and the first and the second OAI complex gates. According to some embodiments, the clock is connected to a clock buffer and the clock buffer is connected to the first and the second OAI complex gates; the clock buffer is also connected to a non-zero even number of serially connected inverters for time borrowing, the non-zero even number of serially connected inverters is connected to the first and the second AOI complex gates.

According to some embodiments, a flip-flop circuit using And-Or-Invert (AOI) and Or-And-Invert (OAI) complex gates disclosed. The circuit includes: a MUX unit with a multiplexer selecting between a data signal (first signal) and a scan-in signal (second signal); a master unit with two And-Or-Invert (AOI) complex gates, the first AOI complex gate is coupled between a first node N1 and a third node N3, the second AOI complex gate is coupled between a second node N2 and a fourth node N4; a slave unit with two Or-And-Invert (OAI) complex gates, the first OAI complex gate is coupled between the third node N3 and a fifth node N5, the second OAI complex gate is coupled between the fourth node N4 and a sixth node N6; and a clock for controlling the two AOI complex gates and the two OAI complex gates, the clock is connected to the first and the second AOI complex gates and the first and the second OAI complex gates.

According to some embodiments, the first AOI complex gate and the second AOI complex gate are implemented with at least three master transistors connected to the clock, the first master transistor is a master upper transistor, the second and the third master transistors are master lower transistors, the second and the third master transistors are clock feedback transistors; the first OAI complex gate and the second OAI complex gate are implemented with at least three slave transistors connected to the clock, the first and the second slave transistors are slave upper transistors, the third slave transistor is a slave lower transistor, the first and the second slave transistors are clock feedback transistors, a signal from the MUX is transmitted from the master unit to the slave unit. According to some embodiments, the first AOI complex gate and the second AOI complex gate are implemented with at least three master transistors connected to the clock, the first and the second master transistors are master upper transistors and the third master transistor is a master lower transistor, the third master transistor is clock feedback transistor; the first OAI complex gate and the second OAI complex gate are implemented with at least three slave transistors connected to the clock, the first slave transistor is a slave upper transistor, the second and the third slave transistors are slave lower transistors, the first slave transistor is clock feedback transistor, a signal from the MUX is transmitted from the master unit to the slave unit.

According to some embodiments, a multi-bit flip-flop circuit using And-Or-Invert (AOI) and Or-And-Invert (OAI) complex gates is disclosed. The multi-bit flip-flop circuit includes a clock for generating clock signals; a plurality of circuits controlled by the clock, each of the plurality of circuits further includes a MUX with a multiplexer selecting between a data signal (first signal) and a scan-in signal (second signal); a master circuit with two Or-And-Invert (OAI) complex gates, the first OAI complex gate is coupled between a first node N1 and a third node N3, the second OAI complex gate is coupled between a second node N2 and a fourth node N4; a slave circuit with two And-Or-Invert (AOI) complex gates, the first AOI complex gate is coupled between the third node N3 and a fifth node N5, the second AOI complex gate is coupled between the fourth node N4 and a sixth node N6; the clock is connected to the first and the second AOI complex gates and the first and the second OAI complex gates. According to some embodiments, the master circuit and the slave circuit of one of the plurality of circuits are implemented with six transistors, an input is transmitted to the MUX of each of the plurality of circuits, an output is transmitted from the salve circuit of each of the plurality of circuits.

According to some embodiments, the first OAI complex gate and the second OAI complex gate of the master circuit of one of the plurality of circuits are implemented with at least three master transistors connected to the clock, the first and the second master transistors are master upper transistors and the third master transistor is a master lower transistor, the first and the second master transistors are clock feedback transistors; the first AOI complex gate and the second AOI complex gate of the slave circuit of one of the plurality of circuits are implemented with at least three slave transistors connected to the clock, the first slave transistor is a slave upper transistor, the second and the third slave transistors are slave lower transistors, the second and the third slave transistors are clock feedback transistors, a signal from the MUX is transmitted from the master unit to the slave unit.

According to some embodiments, the first OAI complex gate and the second OAI complex gate of the master circuit of one of the plurality of circuits are implemented with at least three master transistors connected to the clock, the first master transistor is a master upper transistor, the second and the third master transistors are master lower transistors, the first master transistor is a clock feedback transistor; the first AOI complex gate and the second AOI complex gate of the slave circuit of one of the plurality of circuits are implemented with at least three slave transistors connected to the clock, the first and the second slave transistors are slave upper transistors, the third slave transistor is a slave lower transistor, the third slave transistor is a clock feedback transistor, a signal from the MUX is transmitted from the master unit to the slave unit. According to some embodiments, each of the plurality of circuits further comprises a non-zero even number of serially connected inverters for time borrowing. According to some embodiments, the first AOI complex gate and the second AOI complex gate of the master circuit of one of the plurality of low power circuits are implemented with at least three master transistors connected to the clock, wherein the first master transistor is a master upper transistor, the second and the third master transistors are master lower transistors, wherein the second and the third master transistors are clock feedback transistors; wherein the first OAI complex gate and the second OAI complex gate of the slave circuit of one of the plurality of low power circuits are implemented with at least three slave transistors connected to the clock, wherein the first and the second slave transistors are slave upper transistors, the third slave transistor is a slave lower transistor, wherein the first and the second slave transistors are clock feedback transistors, wherein a signal from the scan chain MUX is transmitted from the master unit to the slave unit.

According to some embodiments, a multi-bit flip-flop circuit using And-Or-Invert (AOI) and Or-And-Invert (OAI) complex gates is disclosed. The multi-bit flip-flop circuit includes a clock for generating clock signals; a plurality of circuits controlled by the clock, each of the plurality of circuits further includes: a MUX with a multiplexer selecting between a data signal (first signal) and a scan-in signal (second signal); a master circuit with two And-Or-Invert (AOI) complex gates, the first AOI complex gate is coupled between a first node N1 and a third node N3, the second AOI complex gate is coupled between a second node N2 and a fourth node N4; a slave circuit with two Or-And-Invert (OAI) complex gates, the first OAI complex gate is coupled between the third node N3 and a fifth node N5, the second OAI complex gate is coupled between the fourth node N4 and a sixth node N6; the clock is connected to the first and the second AOI complex gates and the first and the second OAI complex gates.

According to some embodiments, the master circuit and the slave circuit of one of the plurality of circuits are implemented with six transistors, an input is transmitted to the MUX of each of the plurality of circuits, an output is transmitted from the salve circuit of each of the plurality of circuits. According to some embodiments, the first AOI complex gate and the second AOI complex gate of the master circuit of one of the plurality of circuits are implemented with at least three master transistors connected to the clock, the first master transistor is a master upper transistor, the second and the third master transistors are master lower transistors, the second and the third master transistors are clock feedback transistors; the first OAI complex gate and the second OAI complex gate of the slave circuit of one of the plurality of circuits are implemented with at least three slave transistors connected to the clock, the first and the second slave transistors are slave upper transistors, the third slave transistor is a slave lower transistor, the first and the second slave transistors are clock feedback transistors, a signal from the MUX is transmitted from the master unit to the slave unit.

According to some embodiments, the first AOI complex gate and the second AOI complex gate of the master circuit of one of the plurality of circuits are implemented with at least three master transistors connected to the clock, the first and the second master transistors are master upper transistors and the third master transistor is a master lower transistor, the third master transistor is clock feedback transistor; the first OAI complex gate and the second OAI complex gate of the slave circuit of one of the plurality of circuits are implemented with at least three slave transistors connected to the clock, the first slave transistor is a slave upper transistor, the second and the third slave transistors are slave lower transistors, the first slave transistor is clock feedback transistor, a signal from the MUX is transmitted from the master unit to the slave unit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A flip-flop circuit using And-Or-Invert (AOI) and Or-And-Invert (OAI) gates, the circuit comprising:
   a MUX unit with a multiplexer selecting between a first signal and a second signal;
   a master unit with two Or-And-Invert (OAI) gates, wherein the first OAI gate is coupled between a first node N1 and a third node N3, the second OAI gate is coupled between a second node N2 and a fourth node N4;
   a slave unit with two And-Or-Invert (AOI) gates, wherein the first AOI gate is coupled between the third node N3 and a fifth node N5, the second AOI gate is coupled between the fourth node N4 and a sixth node N6; and
   a clock for controlling the two AOI gates and the two OAI gates, wherein the clock is connected to the first and the second AOI gates and the first and the second OAI gates, wherein the first OAI gate and the second OAI gate are implemented with at least three master transistors connected to the clock, wherein the first AOI gate and the second AOI gate are implemented with at least three slave transistors connected to the clock.

2. The circuit of claim 1, wherein the first and the second master transistors are master upper transistors and the third master transistor is a master lower transistor, wherein the first and the second master transistors are clock feedback transistors; wherein the first slave transistor is a slave upper transistor, the second and the third slave transistors are slave lower transistors, wherein the second and the third slave transistors are clock feedback transistors, wherein a signal from the MUX is transmitted from the master unit to the slave unit.

3. The circuit of claim 1, wherein the first OAI gate and the second OAI gate are implemented with at least three master transistors connected to the clock, wherein the first master transistor is a master upper transistor, the second and the third master transistors are master lower transistors, wherein the first master transistor is a clock feedback transistor; wherein the first AOI gate and the second AOI gate are implemented with at least three slave transistors connected to the clock, wherein the first and the second slave transistors are slave upper transistors, the third slave transistor is a slave lower transistor, wherein the third slave transistor is a clock feedback transistor, wherein a signal from the MUX is transmitted from the master unit to the slave unit.

4. The circuit of claim 1, wherein the clock is directly connected to the first and the second AOI gates, wherein the clock is connected to a non-zero even number of serially connected inverters for time borrowing and then connected to the first and the second OAI gates.

5. The circuit of claim 1, wherein the first AOI complex gate and the second AOI complex gate are implemented with at least three master transistors connected to the clock, wherein the first master transistor is a master upper transistor, the second and the third master transistors are master lower transistors, wherein the second and the third master transistors are clock feedback transistors; wherein the first OAI complex gate and the second OAI complex gate are implemented with at least three slave transistors connected to the clock, wherein the first and the second slave transistors are slave upper transistors, the third slave transistor is a slave lower transistor, wherein the first and the second slave transistors are clock feedback transistors, wherein a signal from the scan chain MUX is transmitted from the master unit to the slave unit.

6. The circuit of claim 1, wherein the clock is connected to a clock buffer and the clock buffer is connected to the first and the second AOI gates and the first and the second OAI gates.

7. The circuit of claim 1, wherein the clock is connected to a clock buffer and the clock buffer is connected to the first and the second OAI gates; wherein the clock buffer is also connected to a non-zero even number of serially connected inverters for time borrowing, the non-zero even number of serially connected inverters is connected to the first and the second AOI gates.

8. A flip-flop circuit using And-Or-Invert (AOI) and Or-And-Invert (OAI) gates, the circuit comprising:
a MUX unit with a multiplexer selecting between a first signal and a second signal;
a master unit with two And-Or-Invert (AOI) gates, wherein the first AOI gate is coupled between a first node N1 and a third node N3, the second AOI gate is coupled between a second node N2 and a fourth node N4;
a slave unit with two Or-And-Invert (OAI) gates, wherein the first OAI gate is coupled between the third node N3 and a fifth node N5, the second OAI gate is coupled between the fourth node N4 and a sixth node N6; and
a clock for controlling the two AOI gates and the two OAI gates, wherein the clock is connected to the first and the second AOI gates and the first and the second OAI gates, wherein the first AOI gate and the second AOI gate are implemented with at least three master transistors connected to the clock, wherein the first OAI gate and the second OAI gate are implemented with at least three slave transistors connected to the clock.

9. The circuit of claim 8, wherein the first master transistor is a master upper transistor, the second and the third master transistors are master lower transistors, wherein the first and the second slave transistors are slave upper transistors, the third slave transistor is a slave lower transistor, wherein the first and the second slave transistors are clock feedback transistors, wherein a signal from the MUX is transmitted from the master unit to the slave unit.

10. The circuit of claim 8, wherein the first AOI gate and the second AOI gate are implemented with at least three master transistors connected to the clock, wherein the first and the second master transistors are master upper transistors and the third master transistor is a master lower transistor, wherein the third master transistor is clock feedback transistor; wherein the first OAI gate and the second OAI gate are implemented with at least three slave transistors connected to the clock, wherein the first slave transistor is a slave upper transistor, the second and the third slave transistors are slave lower transistors, wherein the first slave transistor is clock feedback transistor, wherein a signal from the MUX is transmitted from the master unit to the slave unit.

11. A multi-bit flip-flop circuit using And-Or-Invert (AOI) and Or-And-Invert (OAI) gates, the multi-bit flip-flop circuit comprising:
a clock for generating clock signals;
a plurality of circuits controlled by the clock, wherein each of the plurality of circuits further comprises:
a MUX with a multiplexer selecting between a first signal and a second signal;
a master circuit with two Or-And-Invert (OAI) gates, wherein the first OAI gate is coupled between a first node N1 and a third node N3, the second OAI gate is coupled between a second node N2 and a fourth node N4;
a slave circuit with two And-Or-Invert (AOI) gates, wherein the first AOI gate is coupled between the third node N3 and a fifth node N5, the second AOI gate is coupled between the fourth node N4 and a sixth node N6;
wherein the clock is connected to the first and the second AOI gates and the first and the second OAI gates, wherein the first OAI gate and the second OAI gate of the master circuit of one of the plurality of circuits are implemented with at least three master transistors connected to the clock, wherein the first AOI gate and the second AOI gate of the slave circuit of one of the plurality of circuits are implemented with at least three slave transistors connected to the clock.

12. The multi-bit flip-flop circuit of claim 11, wherein the master circuit and the slave circuit of one of the plurality of circuits are implemented with six transistors, wherein an input is transmitted to the MUX of each of the plurality of circuits, wherein an output is transmitted from the salve circuit of each of the plurality of circuits.

13. The multi-bit flip-flop circuit of claim 11, wherein the first and the second master transistors are master upper transistors and the third master transistor is a master lower transistor, wherein the first slave transistor is a slave upper transistor, the second and the third slave transistors are slave lower transistors, wherein the second and the third slave transistors are clock feedback transistors, wherein a signal from the MUX is transmitted from the master unit to the slave unit.

14. The multi-bit flip-flop circuit of claim 11, wherein the first OAI gate and the second OAI gate of the master circuit of one of the plurality of circuits are implemented with at least three master transistors connected to the clock, wherein the first master transistor is a master upper transistor, the second and the third master transistors are master lower transistors, wherein the first master transistor is a clock feedback transistor; wherein the first AOI gate and the second AOI gate of the slave circuit of one of the plurality of circuits are implemented with at least three slave transistors connected to the clock, wherein the first and the second slave transistors are slave upper transistors, the third slave transistor is a slave lower transistor, wherein the third slave transistor is a clock feedback transistor, wherein a signal from the MUX is transmitted from the master unit to the slave unit.

15. The multi-bit flip-flop circuit of claim 14, wherein each of the plurality of circuits further comprises a non-zero even number of serially connected inverters for time borrowing.

16. The multi-bit flip-flop circuit of claim 11, wherein the first AOI complex gate and the second AOI complex gate of the master circuit of one of the plurality of low power circuits are implemented with at least three master transistors connected to the clock, wherein the first master transistor is a master upper transistor, the second and the third master transistors are master lower transistors, wherein the second and the third master transistors are clock feedback transistors; wherein the first OAI complex gate and the second OAI complex gate of the slave circuit of one of the plurality of low power circuits are implemented with at least three slave transistors connected to the clock, wherein the first and the second slave transistors are slave upper transistors, the third slave transistor is a slave lower transistor, wherein the first and the second slave transistors are clock feedback transistors, wherein a signal from the scan chain MUX is transmitted from the master unit to the slave unit.

17. A multi-bit flip-flop circuit using And-Or-Invert (AOI) and Or-And-Invert (OAI) gates, the multi-bit flip-flop circuit comprising:
   a clock for generating clock signals;
   a plurality of circuits controlled by the clock, wherein each of the plurality of circuits further comprises:
      a MUX with a multiplexer selecting between a first signal and a second signal;
      a master circuit with two And-Or-Invert (AOI) gates, wherein the first AOI gate is coupled between a first node N1 and a third node N3, the second AOI gate is coupled between a second node N2 and a fourth node N4;
      a slave circuit with two Or-And-Invert (OAI) gates, wherein the first OAI gate is coupled between the third node N3 and a fifth node N5, the second OAI gate is coupled between the fourth node N4 and a sixth node N6;
      wherein the clock is connected to the first and the second AOI gates and the first and the second OAI gates, wherein the first AOI gate and the second AOI gate of the master circuit of one of the plurality of circuits are implemented with at least three master transistors connected to the clock, wherein the first OAI gate and the second OAI gate of the slave circuit of one of the plurality of circuits are implemented with at least three slave transistors connected to the clock.

18. The multi-bit flip-flop circuit of claim 17, wherein the master circuit and the slave circuit of one of the plurality of circuits are implemented with six transistors, wherein an input is transmitted to the MUX of each of the plurality of circuits, wherein an output is transmitted from the salve circuit of each of the plurality of circuits.

19. The multi-bit flip-flop circuit of claim 17, wherein the first master transistor is a master upper transistor, the second and the third master transistors are master lower transistors, wherein the first and the second slave transistors are slave upper transistors, the third slave transistor is a slave lower transistor, wherein the first and the second slave transistors are clock feedback transistors, wherein a signal from the MUX is transmitted from the master unit to the slave unit.

20. The multi-bit flip-flop circuit of claim 17, wherein the first AOI gate and the second AOI gate of the master circuit of one of the plurality of circuits are implemented with at least three master transistors connected to the clock, wherein the first and the second master transistors are master upper transistors and the third master transistor is a master lower transistor, wherein the third master transistor is clock feedback transistor; wherein the first OAT gate and the second OAI gate of the slave circuit of one of the plurality of circuits are implemented with at least three slave transistors connected to the clock, wherein the first slave transistor is a slave upper transistor, the second and the third slave transistors are slave lower transistors, wherein the first slave transistor is clock feedback transistor, wherein a signal from the MUX is transmitted from the master unit to the slave unit.

* * * * *